(12) United States Patent
Chang

(10) Patent No.: US 8,945,979 B2
(45) Date of Patent: Feb. 3, 2015

(54) ORGANIC LAYER DEPOSITION APPARATUS, METHOD OF MANUFACTURING ORGANIC LIGHT-EMITTING DISPLAY APPARATUS BY USING THE SAME, AND ORGANIC LIGHT-EMITTING DISPLAY APPARATUS MANUFACTURED BY THE METHOD

(71) Applicant: Samsung Display Co., Ltd., Yongin-si, Gyeonggi-do (KR)

(72) Inventor: Yun-Ho Chang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/797,831

(22) Filed: Mar. 12, 2013

(65) Prior Publication Data
US 2014/0131667 A1    May 15, 2014

(30) Foreign Application Priority Data
Nov. 9, 2012 (KR) .................. 10-2012-0126942

(51) Int. Cl.
| | |
|---|---|
| H01L 51/40 | (2006.01) |
| H01L 51/56 | (2006.01) |
| C23C 14/04 | (2006.01) |
| C23C 14/24 | (2006.01) |
| C23C 14/50 | (2006.01) |

(Continued)

(52) U.S. Cl.
CPC ............. *H01L 51/56* (2013.01); *C23C 14/042* (2013.01); *C23C 14/243* (2013.01); *C23C 14/50* (2013.01); *C23C 14/54* (2013.01); *C23C 14/568* (2013.01); *H01L 27/3244* (2013.01)

USPC ...... 438/99; 438/141; 438/765; 257/E21.006; 257/E21.027; 257/E21.053; 257/E21.129; 257/E21.352

(58) Field of Classification Search
USPC ............. 438/91, 99, 106, 141, 602, 608, 619, 438/765; 257/E21.006, E21.027, E21.053, 257/E21.129, E21.352
See application file for complete search history.

(56) References Cited

U.S. PATENT DOCUMENTS

| | | |
|---|---|---|
| 6,274,198 B1 | 8/2001 | Dautartas |
| 6,371,451 B1 | 4/2002 | Choi |

(Continued)

FOREIGN PATENT DOCUMENTS

| | | |
|---|---|---|
| EP | 1 413 644 A2 | 4/2004 |
| EP | 1 418 250 A2 | 5/2004 |

(Continued)

OTHER PUBLICATIONS

Machine English Translation of JP 2001-052862, 20 pages.

(Continued)

*Primary Examiner* — David Nhu
(74) *Attorney, Agent, or Firm* — Christie, Parker & Hale, LLP

(57) ABSTRACT

An organic layer deposition apparatus, a method of manufacturing an organic light-emitting display apparatus by using the same, and an organic light-emitting display apparatus manufactured by the method, and more particularly, an organic layer deposition apparatus that is suitable for use in the mass production of a large substrate, that enables high-definition patterning, and that is capable of controlling a distance between a patterning slit sheet and a substrate that moves, a method of manufacturing an organic light-emitting display apparatus by using the organic layer deposition apparatus, and an organic light-emitting display apparatus manufactured by the method.

13 Claims, 17 Drawing Sheets

(51) Int. Cl.
*C23C 14/54* (2006.01)
*C23C 14/56* (2006.01)
*H01L 27/32* (2006.01)

(56) References Cited

U.S. PATENT DOCUMENTS

| | | | |
|---|---|---|---|
| 6,749,906 B2* | 6/2004 | Van Slyke | 427/591 |
| 2001/0006827 A1 | 7/2001 | Yamazaki et al. | |
| 2001/0026638 A1 | 10/2001 | Sangu et al. | |
| 2002/0076847 A1 | 6/2002 | Yamada et al. | |
| 2002/0168577 A1 | 11/2002 | Yoon | |
| 2003/0101937 A1 | 6/2003 | Van Slyke et al. | |
| 2003/0168013 A1 | 9/2003 | Freeman et al. | |
| 2003/0221614 A1 | 12/2003 | Kang et al. | |
| 2003/0232563 A1 | 12/2003 | Kamiyama et al. | |
| 2004/0029028 A1 | 2/2004 | Shimizu | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0194702 A1 | 10/2004 | Sasaki et al. | |
| 2004/0195530 A1 | 10/2004 | Kwak et al. | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0153472 A1 | 7/2005 | Yotsuya | |
| 2005/0166842 A1 | 8/2005 | Sakamoto | |
| 2006/0011136 A1 | 1/2006 | Yamazaki et al. | |
| 2006/0144325 A1 | 7/2006 | Jung et al. | |
| 2006/0174829 A1 | 8/2006 | An et al. | |
| 2006/0205101 A1 | 9/2006 | Lee et al. | |
| 2007/0077358 A1 | 4/2007 | Jeong et al. | |
| 2007/0178708 A1 | 8/2007 | Ukigaya | |
| 2008/0018236 A1 | 1/2008 | Arai et al. | |
| 2008/0115729 A1 | 5/2008 | Oda et al. | |
| 2008/0131587 A1 | 6/2008 | Boroson et al. | |
| 2008/0216741 A1 | 9/2008 | Ling et al. | |
| 2009/0017192 A1 | 1/2009 | Matsuura | |
| 2009/0229524 A1 | 9/2009 | Kim et al. | |
| 2009/0232976 A1 | 9/2009 | Yoon et al. | |
| 2010/0297349 A1 | 11/2010 | Lee et al. | |
| 2012/0009328 A1 | 1/2012 | Ryu et al. | |

FOREIGN PATENT DOCUMENTS

| | | |
|---|---|---|
| EP | 1 518 940 A1 | 3/2005 |
| JP | 04-272170 | 9/1992 |
| JP | 08-027568 | 1/1996 |
| JP | 2000-068054 A | 3/2000 |
| JP | 2001-052862 A | 2/2001 |
| JP | 2001-093667 A | 4/2001 |
| JP | 2002-175878 A | 6/2002 |
| JP | 2003-003250 A | 1/2003 |
| JP | 2003-077662 A | 3/2003 |
| JP | 2003-157973 A | 5/2003 |
| JP | 2003-297562 A | 10/2003 |
| JP | 2004-043898 A | 2/2004 |
| JP | 2004-103269 A | 4/2004 |
| JP | 2004-103341 A | 4/2004 |
| JP | 2004-199919 A | 7/2004 |
| JP | 2005-044592 A | 2/2005 |
| JP | 2005-206939 A | 8/2005 |
| JP | 2005-235568 A | 9/2005 |
| JP | 2005-293968 A | 10/2005 |
| JP | 2005-296737 A | 10/2005 |
| JP | 3705237 | 10/2005 |
| JP | 2006-028583 A | 2/2006 |
| JP | 2006-172930 A | 6/2006 |
| JP | 2006-176809 A | 7/2006 |
| JP | 2006-275433 A | 10/2006 |
| JP | 2006-292955 A | 10/2006 |
| JP | 2007-047293 A | 2/2007 |
| JP | 2008-121098 A | 5/2008 |
| JP | 2009-019243 A | 1/2009 |
| JP | 2009-024208 A | 2/2009 |
| JP | 2009-081165 A | 4/2009 |
| JP | 2009-087910 A | 4/2009 |
| JP | 2010-261081 A | 11/2010 |
| KR | 10-2000-0019254 A | 4/2000 |
| KR | 10-2000-0023929 A | 5/2000 |
| KR | 10-19970054303 | 5/2000 |
| KR | 10-2001-0059939 A | 7/2001 |
| KR | 10-2001-0093666 | 10/2001 |
| KR | 10-2002-0000201 A | 1/2002 |
| KR | 10-2002-0050922 A | 6/2002 |
| KR | 10-2002-0090934 A | 12/2002 |
| KR | 10-2003-0034730 A | 5/2003 |
| KR | 10-0405080 | 11/2003 |
| KR | 10-2003-0091947 A | 12/2003 |
| KR | 10-2003-0093959 A | 12/2003 |
| KR | 10-2004-0014258 | 2/2004 |
| KR | 10-2004-0034537 | 4/2004 |
| KR | 2004-0050045 A | 6/2004 |
| KR | 2004-0069281 A | 8/2004 |
| KR | 10-2004-0084747 A | 10/2004 |
| KR | 10-2004-0087142 | 10/2004 |
| KR | 10-0463212 | 12/2004 |
| KR | 10-0520159 | 10/2005 |
| KR | 10-2006-0008602 A | 1/2006 |
| KR | 10-2006-0018745 A | 3/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104288 A | 10/2006 |
| KR | 10-2006-0104675 A | 10/2006 |
| KR | 10-2006-0104677 A | 10/2006 |
| KR | 10-2006-0109627 A | 10/2006 |
| KR | 10-2006-0114462 A | 11/2006 |
| KR | 10-0646160 | 11/2006 |
| KR | 10-2006-0123944 A | 12/2006 |
| KR | 10-0687007 | 2/2007 |
| KR | 10-2007-0025164 A | 3/2007 |
| KR | 10-0696547 B1 | 3/2007 |
| KR | 10-0696550 B1 | 3/2007 |
| KR | 10-0698033 | 3/2007 |
| KR | 10-0700466 | 3/2007 |
| KR | 10-2007-0035796 A | 4/2007 |
| KR | 10-0711885 | 4/2007 |
| KR | 10-2007-0050793 A | 5/2007 |
| KR | 10-0723627 B1 | 5/2007 |
| KR | 10-0726132 | 6/2007 |
| KR | 10-2007-0078713 A | 8/2007 |
| KR | 10-2007-0080635 A | 8/2007 |
| KR | 10-2007-0101842 A | 10/2007 |
| KR | 10-2007-0105595 A | 10/2007 |
| KR | 10-0770653 B1 | 10/2007 |
| KR | 10-0787457 B1 | 12/2007 |
| KR | 10-2008-0001184 A | 1/2008 |
| KR | 10-2008-0003720 A | 1/2008 |
| KR | 10-0797787 | 1/2008 |
| KR | 10-0800125 | 1/2008 |
| KR | 10-0815265 | 3/2008 |
| KR | 10-2008-0036983 A | 4/2008 |
| KR | 10-0823508 B1 | 4/2008 |
| KR | 10-2008-0044775 | 5/2008 |
| KR | 10-0827760 | 5/2008 |
| KR | 10-0839380 | 6/2008 |
| KR | 10-2008-0060400 A | 7/2008 |
| KR | 10-2008-0061132 A | 7/2008 |
| KR | 10-2008-0061774 A | 7/2008 |
| KR | 10-2008-0062212 A | 7/2008 |
| KR | 10-2009-0038733 A | 4/2009 |
| KR | 10-2009-0097453 | 9/2009 |
| KR | 10-2010-0099806 A | 9/2010 |
| KR | 10-2010-0126125 A | 12/2010 |
| KR | 10-2012-0006324 A | 1/2012 |

OTHER PUBLICATIONS

Machine English Translation of JP 2003-003250, 25 pages.
Machine English Translation of JP 2009-024208, 30 pages.
Korean Office action dated Aug. 1, 2011 for corresponding Korean Patent No. 10-2009-0074001, 3 pages.

(56) References Cited

OTHER PUBLICATIONS

Korean Office action dated Feb. 1, 2012 for corresponding Korean Patent No. 10-2010-0014272, 4 pages.
Korean Office action dated Feb. 6, 2012 for corresponding Korean Patent No. 10-2010-0021835, 4 pages.
Korean Office action dated Apr. 2, 2012 for corresponding Korean Patent No. 10-2010-0066993, 4 pages.
KIPO Registration Determination Certificate dated Aug. 24, 2012, for Korean Patent application 10-2010-0066993, 5 pages.
Korean Patent Abstracts, Publication No. 10-2002-0086047 A, dated Nov. 18, 2002, for corresponding Korean Patent No. 10-0405080, 2 pages.
Korean Patent Abstracts, Publication No. 10-2002-0088662 A, dated Nov. 29, 2002, for corresponding Korean Patent No. 10-0463212, 2 pages.
Korean Patent Abstracts, Publication No. 10-2005-0045619 A, dated May 17, 2005, for corresponding Korean Patent No. 10-0520159, 2 pages.
Korean Patent Abstracts, Publication No. 10-2004-0062203 A, dated Jul. 7, 2004, for corresponding Korean Patent No. 10-0646160, 2 pages.
Korean Patent Abstracts, Publication No. 10-2006-0101987 A, dated Sep. 27, 2006, for corresponding Korean Patent No. 10-0687007, 2 pages.
Korean Patent Abstracts, Publication No. 10-2002-0056238 A, dated Jul. 10, 2001, for corresponding Korean Patent No. 10-0698033, 2 pages.
Korean Patent Abstracts, Publication No. 10-2005-0078637 A, dated Aug. 5, 2005, for corresponding Korean Patent No. 10-0700466, 2 pages.
Korean Patent Abstracts, Publication No. 10-2007-0025164 A, dated Mar. 8, 2007, for corresponding Korean Patent No. 10-0711885, 2 pages.
Korean Patent Abstracts, Publication No. 10-2002-0034272 A, dated May 9, 2002, for corresponding Korean Patent No. 10-0726132, 2 pages.
Korean Patent Abstracts, Publication No. 10-2006-0126267 A, dated Dec. 7, 2006, for corresponding Korean Patent No. 10-0797787, 2 pages.
English Abstract, Publication No. 10-2008-0002189 A, dated Jan. 4, 2008, for corresponding Korean Patent No. 10-0800125, 1 page.
Korean Patent Abstracts, Publication No. 10-2007-0050793 A, dated May 16, 2007, for corresponding Korean Patent No. 10-0815265, 2 pages.
Korean Patent Abstracts, Publication No. 10-2001-0062735 A, dated Jul. 7, 2001, for corresponding Korean Patent No. 10-0827760, 2 pages.
Korean Patent Abstracts, Publication No. 10-2008-0038650 A, dated May 7, 2008, for corresponding Korean Patent No. 10-0839380, 2 pages.
Korean Patent Abstracts, Publication No. 10-2008-0022592 A, dated Mar. 11, 2008, for corresponding Korean Patent No. 10-2009-0097453, 2 pages.

* cited by examiner

ORGANIC LAYER DEPOSITION APPARATUS, METHOD OF MANUFACTURING ORGANIC LIGHT-EMITTING DISPLAY APPARATUS BY USING THE SAME, AND ORGANIC LIGHT-EMITTING DISPLAY APPARATUS MANUFACTURED BY THE METHOD

CROSS-REFERENCE TO RELATED PATENT APPLICATION

This application claims priority to and the benefit of Korean Patent Application No. 10-2012-0126942, filed on Nov. 9, 2012, in the Korean Intellectual Property Office, the disclosure of which is incorporated herein in its entirety by reference.

BACKGROUND

1. Field

The following description relates to an organic layer deposition apparatus, a method of manufacturing an organic light-emitting display apparatus by using the same, and an organic light-emitting display apparatus manufactured by the method, and more particularly, to an organic layer deposition apparatus that is suitable for use in the mass production of a large substrate, that enables high-definition patterning, and that is capable of measuring and constantly maintaining a gap between a substrate and a patterning slit sheet that relatively move with respect to each other, a method of manufacturing an organic light-emitting display apparatus by using the organic layer deposition apparatus, and an organic light-emitting display apparatus manufactured by the method.

2. Description of the Related Art

Organic light-emitting display devices have wider viewing angles, better contrast characteristics, and faster response speeds than other display devices, and thus have drawn attention as a next-generation display device.

An organic light-emitting display device includes intermediate layers (including an emission layer) disposed between a first electrode and a second electrode. The electrodes and the intermediate layers may be formed using various methods, one of which is an independent deposition method. When an organic light-emitting display device is manufactured by using the deposition method, a fine metal mask (FMM) having the same pattern as that of an organic layer to be formed is disposed to closely contact a substrate on which the organic layer and the like are formed, and an organic layer material is deposited on the FMM to form the organic layer having the desired pattern.

However, the deposition method using such an FMM presents difficulties in manufacturing larger organic light-emitting display devices using a large mother glass. For example, when such a large mask is used, the mask may bend due to a gravitational pull, thereby distorting its pattern. Such disadvantages are not conducive to the recent trend towards high-definition patterns.

Moreover, processes of aligning a substrate and an FMM to closely contact each other, performing deposition thereon, and separating the FMM from the substrate are time-consuming, resulting in a long manufacturing time and low production efficiency.

Information disclosed in this Background section was already known to the inventors of the present invention before achieving the present invention or is technical information acquired in the process of achieving the present invention. Therefore, it may contain information that does not form the prior art that is already known in this country to a person of ordinary skill in the art.

SUMMARY

Aspects of embodiments of the present invention are directed toward an organic layer deposition apparatus that is suitable for use in the mass production of a large substrate, that enables high-definition patterning, and that is capable of controlling a distance between a patterning slit sheet and a substrate that moves, a method of manufacturing an organic light-emitting display apparatus by using the organic layer deposition apparatus, and an organic light-emitting display apparatus manufactured by the method.

According to an embodiment of the present invention, there is provided an organic layer deposition apparatus including a conveyer unit including a transfer unit for fixing a substrate and configured to move along with the substrate, a first conveyer unit for moving in a first direction the transfer unit on which the substrate is fixed, and a second conveyer unit for moving in a direction opposite to the first direction the transfer unit from which the substrate is separated after deposition has been completed; a loading unit for fixing the substrate on the transfer unit; a deposition unit including a chamber maintained in a vacuum state and an organic layer deposition assembly for depositing an organic layer on the substrate fixed on the transfer unit transferred from the loading unit; and an unloading unit for separating, from the transfer unit, the substrate on which the deposition has been completed while passing through the deposition unit, wherein the transfer unit is configured to cyclically move between the first conveyer unit and the second conveyer unit, the substrate fixed on the transfer unit is configured to be spaced apart from the organic layer deposition assembly by a set distance while being transferred by the first conveyer unit, and wherein the organic layer deposition assembly includes a deposition source for discharging a deposition material; a deposition source nozzle unit at a side of the deposition source and including a plurality of deposition source nozzles; a patterning slit sheet facing the deposition source nozzle unit and including a plurality of patterning slits arranged along a direction; and a gap measuring unit for measuring a gap between the substrate and the patterning slit sheet, and wherein the deposition material that is discharged from the deposition source passes through the patterning slit sheet to be deposited on the substrate in a certain pattern.

The gap measuring unit may include first gap measuring parts that are not disposed on the patterning slit sheet but are disposed on a virtual plane extending from the patterning slit sheet; and second gap measuring parts that are disposed on the patterning slit sheet.

The first gap measuring parts may include at least two gap measuring units and the second gap measuring parts may include at least four gap measuring units.

The first gap measuring parts may include a first gap measuring unit and a sixth gap measuring unit, the second gap measuring parts may include a second gap measuring unit, a third gap measuring unit, a fourth gap measuring unit, and a fifth gap measuring unit, the first gap measuring unit, the second gap measuring unit, and the third gap measuring unit may be disposed whereby virtual lines that connect the first, second, and third gap measuring units may form a triangle, and the fourth gap measuring unit, the fifth gap measuring unit, and the sixth gap measuring unit may be disposed whereby virtual lines that connect the fourth, fifth, and sixth gap measuring units may form a triangle.

The first gap measuring unit, the second gap measuring unit, and the fourth gap measuring unit may be disposed on a first virtual line, and the third gap measuring unit, the fifth gap measuring unit, and the sixth gap measuring unit may be disposed on a second virtual line.

The first virtual line and the second virtual line may be in parallel with the first direction.

A line that connects the first gap measuring unit and the second gap measuring unit may be a first side, a line that connects the second gap measuring unit and the third gap measuring unit may be a second side, a line that connects the third gap measuring unit and the first gap measuring unit may be a third side, and the first side and the second side may be perpendicular to each other, and the third side may correspond to a slant side of the triangle.

A line that connects the fifth gap measuring unit and the sixth gap measuring unit may be a fourth side, a line that connects the fourth gap measuring unit and the fifth gap measuring unit may be a fifth side, a line that connects the sixth gap measuring unit and the fourth gap measuring unit may be a sixth side, and the fourth side and the fifth side may be perpendicular to each other, and the sixth side may correspond to a slant side of the triangle.

When the substrate moves in the first direction and thus is positioned below the first gap measuring unit, the second gap measuring unit, and the third gap measuring unit, the first gap measuring unit may measure a distance to the substrate, and each of the second gap measuring unit and the third gap measuring unit may measure a distance to the substrate and a distance to the patterning slit sheet, whereby the first gap measuring unit, the second gap measuring unit, and the third gap measuring unit may measure distances between the substrate and the patterning slit sheet at the first gap measuring unit, the second gap measuring unit, and the third gap measuring unit, respectively.

The first gap measuring unit may obtain the distance between the substrate and the patterning slit sheet by using a distance between the first gap measuring unit and a virtual patterning slit sheet as the distance to the patterning slit sheet, wherein the distance to the patterning slit sheet is measured by the second gap measuring unit or the third gap measuring unit.

When the distances between the substrate and the patterning slit sheet which are measured by the first gap measuring unit, the second gap measuring unit, and the third gap measuring unit are different from each other, the patterning slit sheet may be moved to synchronize the distances.

When the substrate moves in the first direction and thus is positioned below the second gap measuring unit, the third gap measuring unit, and the fifth gap measuring unit, each of the second gap measuring unit, the third gap measuring unit, and the fifth gap measuring unit may measure a distance to the substrate and a distance to the patterning slit sheet and thus may obtain a distance between the substrate and the patterning slit sheet at each of positions of the second gap measuring unit, the third gap measuring unit, and the fifth gap measuring unit.

When the distances between the substrate and the patterning slit sheet which are measured by the second gap measuring unit, the third gap measuring unit, and the fifth gap measuring unit are different from each other, the patterning slit sheet may be moved to synchronize the distances.

When the substrate moves in the first direction and thus is positioned below the fourth gap measuring unit, the fifth gap measuring unit, and the sixth gap measuring unit, the sixth gap measuring unit may measure a distance to the substrate, and each of the fourth gap measuring unit and the fifth gap measuring unit may measure a distance to the substrate and a distance to the patterning slit sheet, whereby the fourth gap measuring unit, the fifth gap measuring unit, and the sixth gap measuring unit may measure distances between the substrate and the patterning slit sheet at the fourth gap measuring unit, the fifth gap measuring unit, and the sixth gap measuring unit, respectively.

The sixth gap measuring unit may obtain the distance between the substrate and the patterning slit sheet by using a distance between the sixth gap measuring unit and a virtual patterning slit sheet as the distance to the patterning slit sheet, wherein the distance to the patterning slit sheet is measured by the fourth gap measuring unit or the fifth gap measuring unit.

When the distances between the substrate and the patterning slit sheet which are measured by the fourth gap measuring unit, the fifth gap measuring unit, and the sixth gap measuring unit are different from each other, the patterning slit sheet may be moved to synchronize the distances.

The first conveyer unit and the second conveyer unit may be configured to pass through the deposition unit.

The first conveyer unit and the second conveyer unit may be respectively arranged above and below in parallel to each other.

The first conveyer unit may be configured to sequentially convey the transfer unit into the loading unit, the deposition unit, and the unloading unit.

The second conveyer unit may be configured to sequentially convey the transfer unit into the unloading unit, the deposition unit, and the loading unit.

The patterning slit sheet of the organic layer deposition assembly may be formed smaller than the substrate in the first direction.

According to another embodiment of the present invention, there is provided a method of manufacturing an organic light-emitting display apparatus by using an organic layer deposition apparatus for forming an organic layer on a substrate, the method including operations of fixing the substrate on a transfer unit in a loading unit; conveying, into a chamber, the transfer unit on which the substrate is fixed, by using a first conveyer unit installed to pass through the chamber; forming an organic layer by depositing a deposition material discharged from an organic layer deposition assembly on the substrate while the substrate is moved relative to the organic layer deposition assembly with the organic layer deposition assembly in the chamber being spaced apart from the substrate by a set distance; separating the substrate on which the depositing has been completed from the transfer unit in an unloading unit; and conveying the transfer unit from which the substrate is separated to the loading unit by using a second conveyer unit installed to pass through the chamber, and wherein the operation of forming the organic layer includes an operation of measuring a distance between the substrate and the patterning slit sheet while the substrate relatively moves with respect to the organic layer deposition assembly.

The chamber may include a plurality of the organic layer deposition assemblies, and deposition may be sequentially performed on the substrate by using each of the plurality of the organic layer deposition assemblies.

The transfer unit may be configured to cyclically move between the first conveyer unit and the second conveyer unit.

The first conveyer unit and the second conveyer unit may be respectively arranged above and below in parallel to each other.

The patterning slit sheet of the organic layer deposition assembly may be formed smaller than the substrate in the first direction.

The organic layer deposition assembly may include a deposition source for discharging a deposition material; a deposition source nozzle unit at a side of the deposition source and including a plurality of deposition source nozzles; a patterning slit sheet facing the deposition source nozzle unit and including a plurality of patterning slits arranged along a direction; and a gap measuring unit for measuring a gap between the substrate and the patterning slit sheet, and the gap measuring unit may include first gap measuring parts that are not disposed on the patterning slit sheet but are disposed on a virtual plane extending from the patterning slit sheet; and second gap measuring parts that are disposed on the patterning slit sheet.

The first gap measuring parts may include at least two gap measuring units and the second gap measuring parts may include at least four gap measuring units.

The first gap measuring parts may include a first gap measuring unit and a sixth gap measuring unit, the second gap measuring parts may include a second gap measuring unit, a third gap measuring unit, a fourth gap measuring unit, and a fifth gap measuring unit, the first gap measuring unit, the second gap measuring unit, and the third gap measuring unit may be disposed whereby virtual lines that connect the first, second, and third gap measuring units may form a triangle, and the fourth gap measuring unit, the fifth gap measuring unit, and the sixth gap measuring unit may be disposed whereby virtual lines that connect the fourth, fifth, and sixth gap measuring units may form a triangle.

When the substrate moves and thus is positioned below the first gap measuring unit, the second gap measuring unit, and the third gap measuring unit, the operation of measuring the distance may include operations of measuring, by the first gap measuring unit, a distance to the substrate, measuring, by each of the second gap measuring unit and the third gap measuring unit, a distance to the substrate and a distance to the patterning slit sheet, and thus measuring distances between the substrate and the patterning slit sheet at the first gap measuring unit, the second gap measuring unit, and the third gap measuring unit, respectively; and when the distances between the substrate and the patterning slit sheet which are measured by the first gap measuring unit, the second gap measuring unit, and the third gap measuring unit are different from each other, the operation of measuring the distance may include an operation of moving the patterning slit sheet so as to synchronize the distances.

The first gap measuring unit may obtain the distance between the substrate and the patterning slit sheet by using a distance between the first gap measuring unit and a virtual patterning slit sheet as the distance to the patterning slit sheet, wherein the distance to the patterning slit sheet is measured by the second gap measuring unit or the third gap measuring unit.

When the substrate moves and thus is positioned below the second gap measuring unit, the third gap measuring unit, and the fifth gap measuring unit, the operation of measuring the distance may include operations of, by each of the second gap measuring unit, the third gap measuring unit, and the fifth gap measuring unit, measuring a distance to the substrate and a distance to the patterning slit sheet and obtaining a distance between the substrate and the patterning slit sheet at each of positions of the second gap measuring unit, the third gap measuring unit, and the fifth gap measuring unit; and when the distances between the substrate and the patterning slit sheet which are measured by the second gap measuring unit, the third gap measuring unit, and the fifth gap measuring unit are different from each other, the operation of measuring the distance may include an operation of moving the patterning slit sheet so as to synchronize the distances.

When the substrate moves and thus is positioned below the fourth gap measuring unit, the fifth gap measuring unit, and the sixth gap measuring unit, the operation of measuring the distance may include operations of measuring, by the sixth gap measuring unit, a distance to the substrate, measuring, by each of the fourth gap measuring unit and the fifth gap measuring unit, a distance to the substrate and a distance to the patterning slit sheet, and thus measuring distances between the substrate and the patterning slit sheet at the fourth gap measuring unit, the fifth gap measuring unit, and the sixth gap measuring unit, respectively; and when the distances between the substrate and the patterning slit sheet which are measured by the fourth gap measuring unit, the fifth gap measuring unit, and the sixth gap measuring unit are different from each other, the operation of measuring the distance may include an operation of moving the patterning slit sheet so as to synchronize the distances.

The sixth gap measuring unit may obtain the distance between the substrate and the patterning slit sheet by using as a distance between the sixth gap measuring unit and a virtual patterning slit sheet as the distance to the patterning slit sheet, wherein the distance to the patterning slit sheet is measured by the fourth gap measuring unit or the fifth gap measuring unit.

According to another embodiment of the present invention, there is provided an organic light-emitting display device including a substrate; a thin film transistor on the substrate and includes a semiconductor active layer, a gate electrode insulated from the semiconductor active layer, and source and drain electrodes each contacting the semiconductor active layer; a plurality of pixel electrodes on the thin film transistor; a plurality of organic layers on the plurality of the pixel electrodes; and a counter electrode disposed on the plurality of organic layers, wherein a length of a hypotenuse of at least one of the plurality of organic layers on the substrate farther from a center of a deposition region is larger than lengths of hypotenuses of those other organic layers formed closer to the center of the deposition region, and wherein the at least one of the plurality of organic layers on the substrate is a linearly-patterned organic layer formed using the organic layer deposition apparatus.

The substrate may have a size of 40 inches or more.

The plurality of organic layers may include at least an emission layer.

The plurality of organic layers may have non-uniform thicknesses.

In each of the organic layers formed farther from the center of the deposition region, a hypotenuse farther from the center of the deposition region may be larger than the other hypotenuse.

The further one of the plurality of organic layers in the deposition region is from the center of the deposition region, the narrower an overlapped region of two sides of the one of the plurality of organic layers may be formed.

Hypotenuses of the organic layer disposed at the center of the deposition region may have substantially the same length.

The plurality of organic layers in the deposition region may be symmetrically arranged about the center of the deposition region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
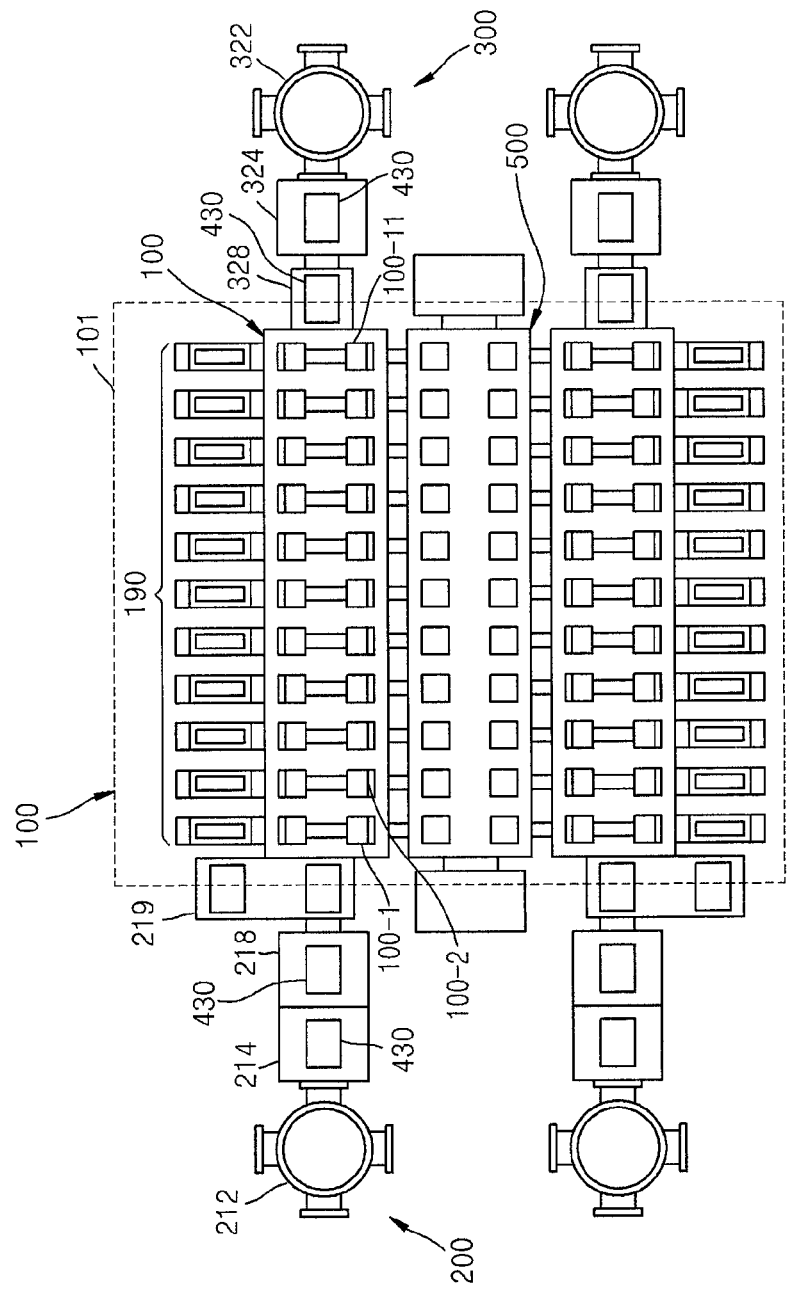
FIG. 1 is a schematic plan view illustrating a structure of an organic layer deposition apparatus according to an embodiment of the present invention.

Hereinafter, the present invention will be described in detail by explaining exemplary embodiments of the invention with reference to the attached drawings. Like reference numerals in the drawings denote like elements.

Reference will now be made in more detail to the present embodiments of the present invention, examples of which are illustrated in the accompanying drawings, wherein like reference numerals refer to the like elements throughout. The embodiments are described below in order to explain aspects of the present invention by referring to the figures. Expressions such as "at least one of," when preceding a list of elements, modify the entire list of elements and do not modify the individual elements of the list.

Figure 2:
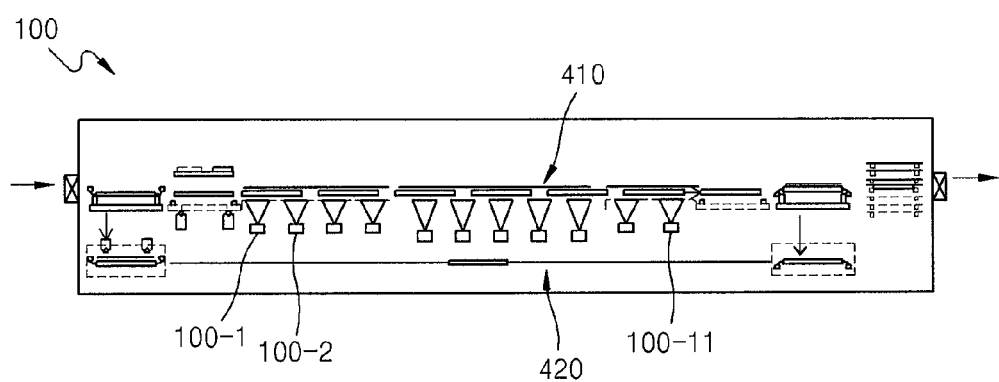
FIG. 2 is a schematic side view of a deposition unit of the organic layer deposition apparatus of FIG. 1, according to an embodiment of the present invention.

FIG. 1 is a schematic plan view illustrating a structure of an organic layer deposition apparatus 1 according to an embodiment of the present invention. FIG. 2 is a schematic side view of a deposition unit 100 of the organic layer deposition apparatus 1 of FIG. 1, according to an embodiment of the present invention.

Referring to FIGS. 1 and 2, the organic layer deposition apparatus 1 includes the deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 onto which a deposition material has not yet been applied are stacked up on the first rack 212. A transport robot included in the transport chamber 214 picks up one of the substrates 2 from the first rack 212, disposes it on a transfer unit 430 transferred by a second conveyer unit 420, and moves the transfer unit 430 on which the substrate 2 is disposed into the first inversion chamber 218.

The first inversion chamber 218 is disposed adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430 on which the substrate 2 is disposed is then transferred into the first inversion chamber 218. The first inversion robot of the first inversion chamber 218 inverts the first inversion chamber 218 so that the substrate 2 is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is disposed on the transfer unit 430, and then moves the transfer unit 430 on which the substrate 2 is disposed into an ejection chamber 324. Then, an ejection robot takes the transfer unit 430 on which the substrate 2 is disposed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above example. For example, when disposing the substrate 2 on the transfer unit 430, the substrate 2 may be fixed onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies 100-1, 100-2, ..., 100-n may be disposed. Referring to FIG. 1, 11 organic layer deposition assemblies, i.e., a first organic layer deposition assembly 100-1, a second organic layer deposition assembly 100-2, ... and an eleventh organic layer deposition assembly 100-11, are disposed in the chamber 101, but the number of organic layer deposition assemblies may vary with a desired deposition material and deposition conditions. The chamber 101 is maintained in vacuum during the deposition process.

In the embodiment illustrated in FIG. 1, the transfer unit 430 with the substrate 2 fixed thereon may be moved at least to the deposition unit 100 or may be moved sequentially to the loading unit 200, the deposition unit 100, and the unloading unit 300, by the first conveyer unit 410, and the transfer unit 430 that is separated from the substrate 2 in the unloading unit 300 may be moved back to the loading unit 200 by the second conveyer unit 420.

The first conveyer unit 410 passes through the chamber 101 when passing through the deposition unit 100, and the second conveyer unit 420 conveys the transfer unit 430 from which the substrate 2 is separated.

In the present embodiment, the organic layer deposition apparatus 1 is configured such that the first conveyer unit 410 and the second conveyer unit 420 are respectively disposed above and below so that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed below the first conveyer unit 410, whereby the organic layer deposition apparatus 1 may have an improved space utilization efficiency.

In an embodiment, the deposition unit 100 of FIG. 1 may further include a deposition source replacement unit 190 disposed at a side of each organic layer deposition assembly. Although not particularly illustrated in the drawings, the deposition source replacement unit 190 may be formed as a cassette-type that may be drawn to the outside from each organic layer deposition assembly. Thus, a deposition source 110 (refer to FIG. 3) of the organic layer deposition assembly 100-1 may be easily replaced.

FIG. 1 illustrates two sets of the organic layer deposition apparatus 1 that includes the loading unit 200, the deposition unit 100, the unloading unit 300, and the conveyer unit 400. That is, in FIG. 1, two organic layer deposition apparatuses 1 are vertically arranged. In this case, a patterning slit sheet replacement unit 500 may be further arranged between the two organic layer deposition apparatuses 1. That is, since the patterning slit sheet replacement unit 500 is arranged between the two organic layer deposition apparatuses 1, the two organic layer deposition apparatuses 1 jointly use the patterning slit sheet replacement unit 500, so that a space may be further efficiently used, compared to a case in which each of the two organic layer deposition apparatuses 1 has its own separate patterning slit sheet replacer 500.

Figure 3:
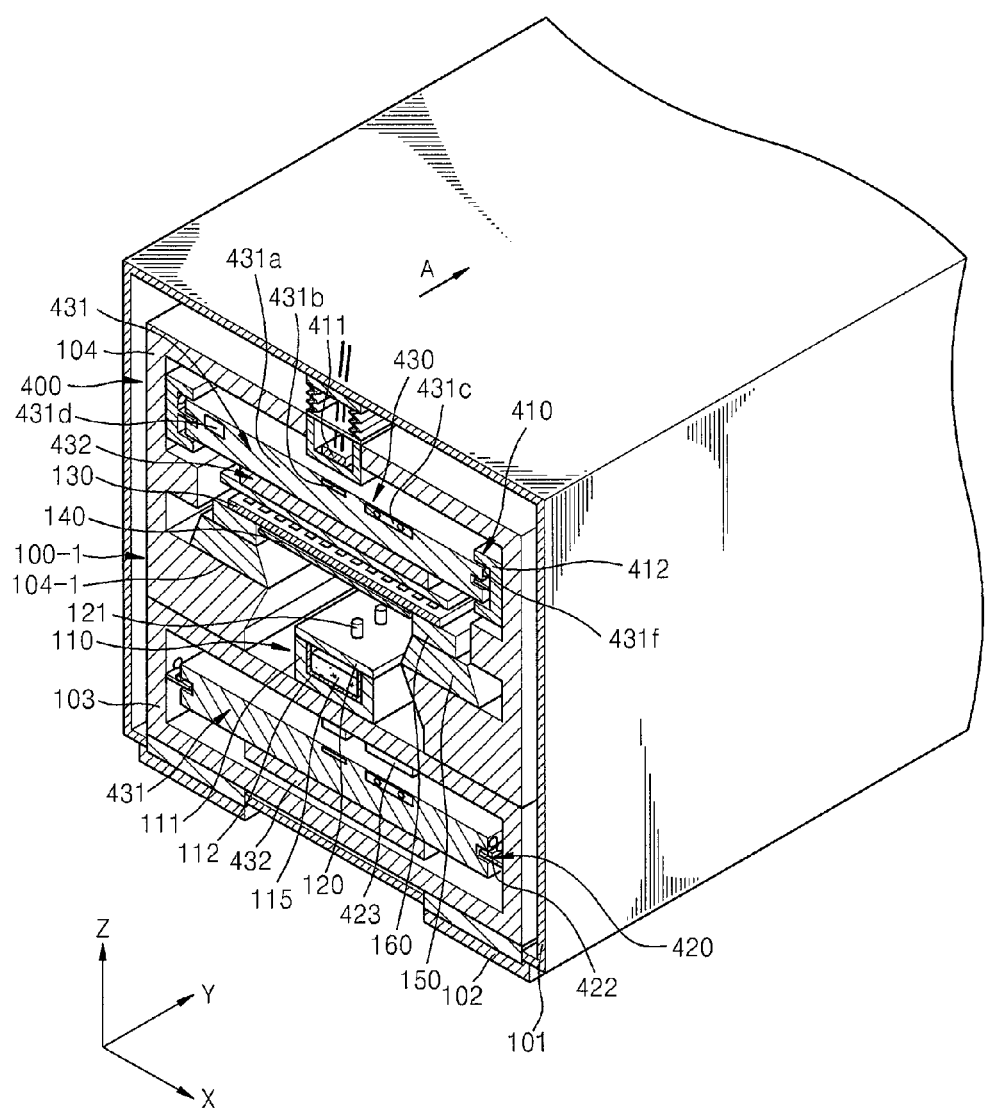
FIG. 3 is a schematic perspective view of the deposition unit of the organic layer deposition apparatus of FIG. 1, according to an embodiment of the present invention.
Figure 4:
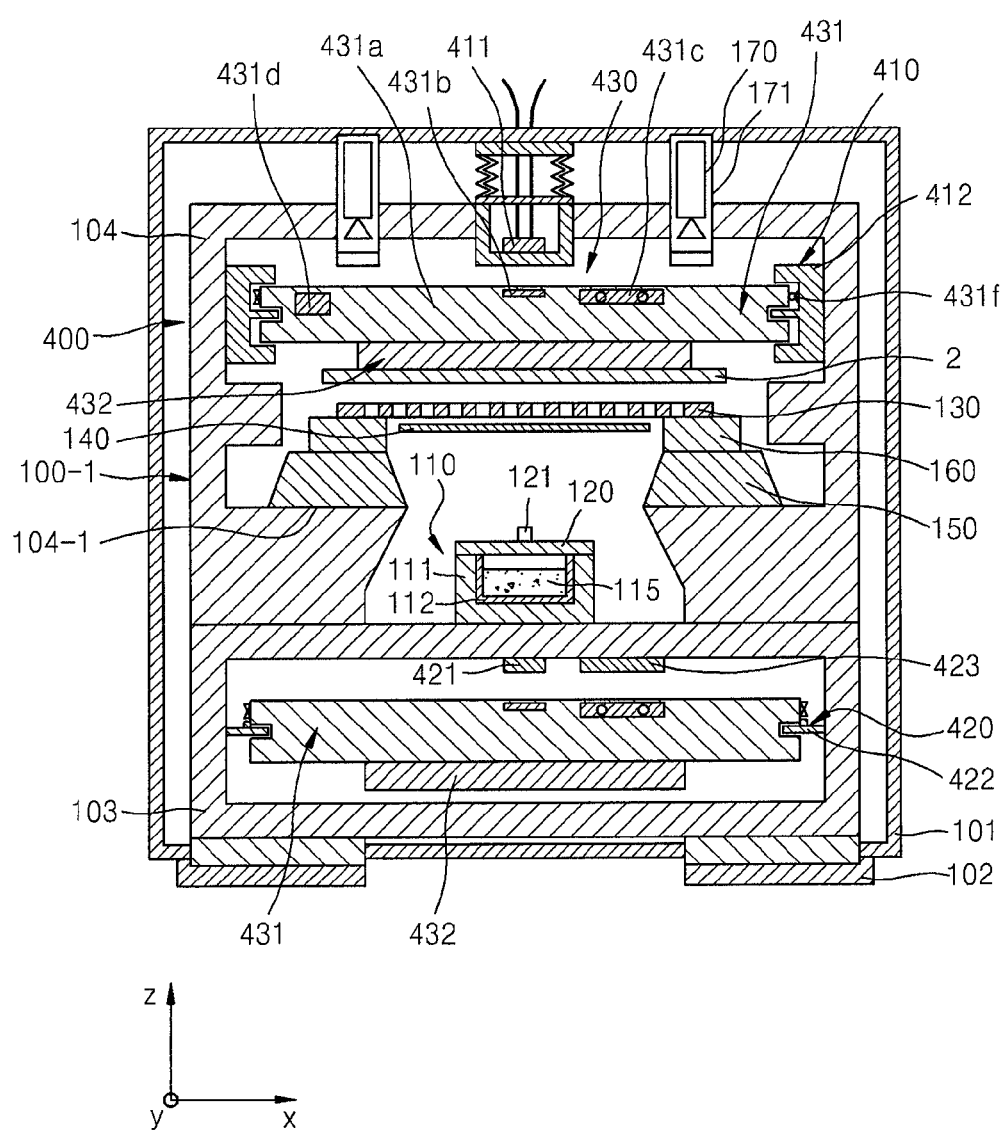
FIG. 4 is a schematic cross-sectional view of the deposition unit of FIG. 3, according to an embodiment of the present invention.
Figure 5:
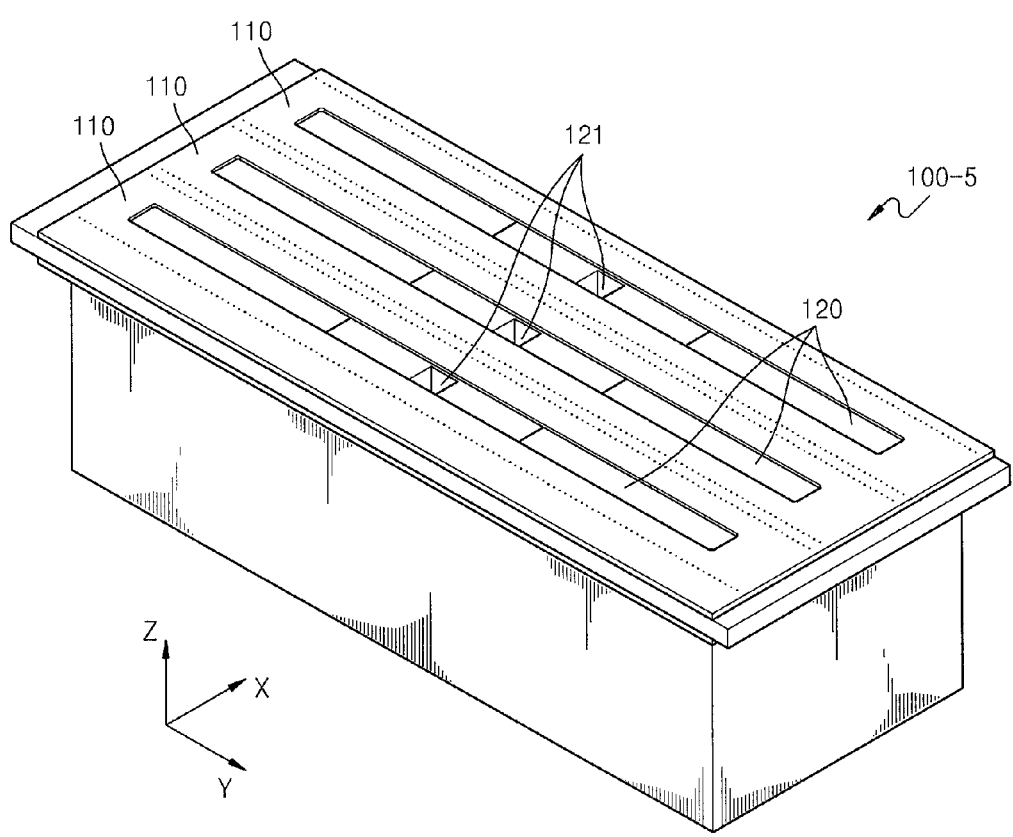
FIG. 5 is a perspective view of a deposition source of the deposition unit of FIG. 3, according to an embodiment of the present invention.
Figure 6:
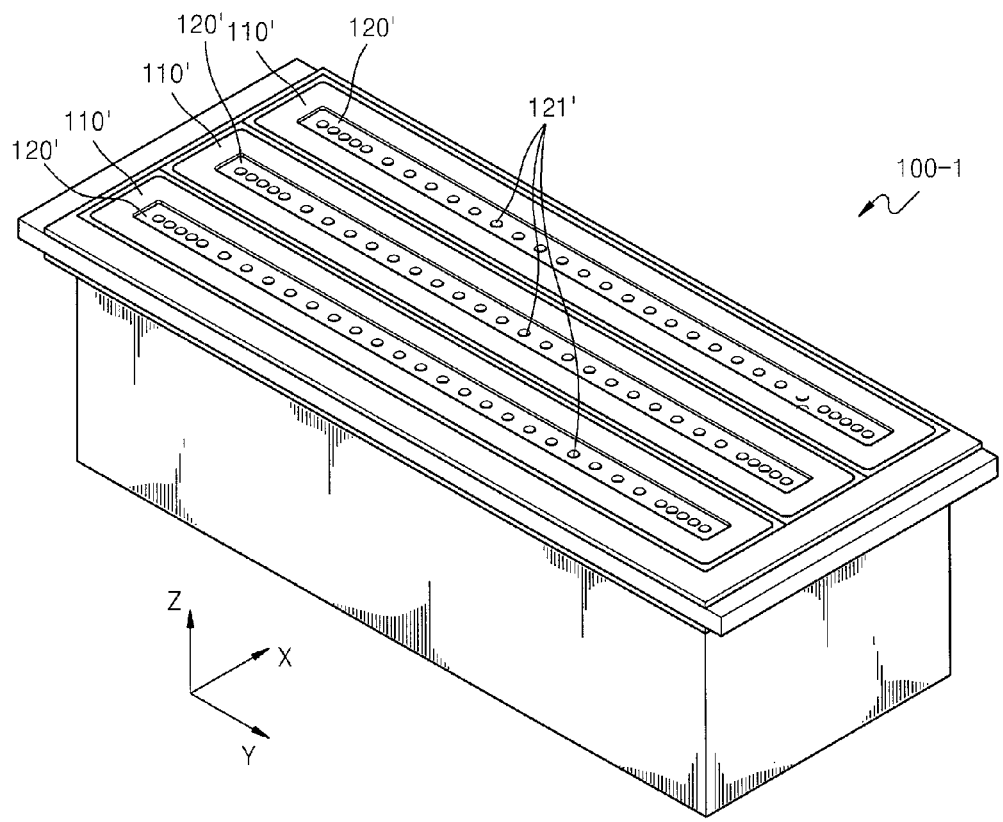
FIG. 6 is a perspective view of a deposition source of the deposition unit of FIG. 3, according to another embodiment of the present invention.
Figure 7:
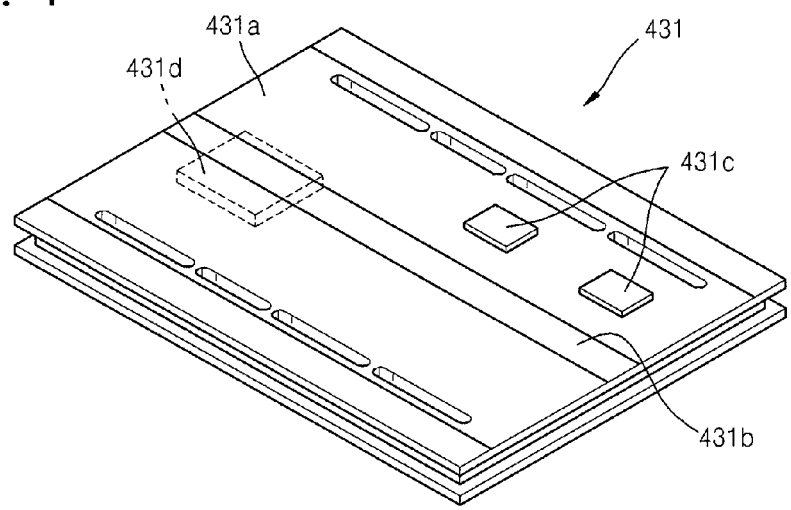
FIG. 7 is a perspective view that particularly illustrates a carrier of a transfer unit of the deposition unit of FIG. 3, according to an embodiment of the present invention.

FIG. 3 is a schematic perspective view of the deposition unit 100 of the organic layer deposition apparatus 1 of FIG. 1, according to an embodiment of the present invention. FIG. 4 is a schematic cross-sectional view of the deposition unit 100 of FIG. 3, according to an embodiment of the present invention. FIG. 5 is a perspective view of a deposition source 110 of the deposition unit 100 of FIG. 3, according to an embodiment of the present invention. FIG. 6 is a perspective view of a deposition source 110' of the deposition unit 100 of FIG. 3, according to another embodiment of the present invention. FIG. 7 is a perspective view that particularly illustrates a carrier 431 of a transfer unit 400 of the deposition unit 100 of FIG. 3, according to an embodiment of the present invention.

Referring to FIGS. 3 and 4, the deposition unit 100 of the organic layer deposition apparatus 1 includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the transfer unit 430. In another descriptive manner, a foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in detail.

The first organic layer deposition assembly 100-1 includes the deposition source 110, a deposition source nozzle unit 120, the patterning slit sheet 130, a shielding member 140, a first stage 150, a second stage 160, and a gap measuring unit 170. In this regard, all the elements illustrated in FIGS. 3 and 4 may be arranged in the chamber 101 maintained in an appropriate vacuum state. This structure is needed to achieve the linearity of a deposition material.

In particular, in order to deposit a deposition material 115 that has been discharged from the deposition source 110 and passed through the deposition source nozzle unit 120 and the patterning slit sheet 130, onto the substrate 2 in a desired pattern, it is desirable to maintain the chamber (not shown) in the same vacuum state as that used in a deposition method of an FMM. In addition, the temperature of the patterning slit sheet 130 should be sufficiently lower than that of the deposition source 110 because thermal expansion of the patterning slit sheet 130 is minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate having a size of at least 40 inches, such as a mother glass, for manufacturing a plurality of flat panel displays, may be used as the substrate 2.

According to an embodiment, the deposition process may be performed with the substrate 2 being moved relative to the organic layer deposition assembly 100-1.

In a conventional deposition method using an FMM, the size of the FMM needs to be the same as that of a substrate. Thus, as the size of the substrate increases, the FMM also needs to be large in size. Due to these problems, it is difficult to fabricate the FMM and to align the FMM in a precise pattern by elongation of the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as being moved in the Y-axis direction in the chamber 101 in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be much smaller than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is easy to manufacture the patterning slit sheet 130. That is, the small patterning slit sheet 130 is more advantageous in the manufacturing processes, including etching followed by precise elongation, welding, transferring, and washing processes, than the FMM used in a conventional deposition method. In addition, this is more advantageous for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance. This is described below in more detail.

The deposition source 110 that contains and heats the deposition material 115 is disposed at a side opposite to (facing) a side in which the substrate 2 is disposed in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source 110, in one embodiment, is disposed at a side of the deposition source 110 facing the substrate 2. In this regard, the organic layer deposition assemblies according to the present embodiment each may include different deposition nozzles in performing deposition for forming common layers and pattern layers. Hereinafter, this will be described in more detail.

FIG. 5 is a perspective view of deposition source nozzles 121 used to form a pattern layer, and FIG. 6 is a perspective view of deposition source nozzles 121' used to form a common layer.

First, referring to FIG. 5, three deposition sources 110 and three deposition source nozzle units 120 are arranged in the first organic layer deposition assembly 100-1, and the deposition source nozzles 121 are arranged in centers of the deposition source nozzle units 120, respectively. Thus, the deposition material 115 that has been vaporized in the deposition source 110 passes through the deposition source nozzle unit 120 and then moves toward the substrate 2 that is a deposition target. As described above, one deposition source nozzle 121 is formed on the deposition source nozzle unit 120, and three deposition sources 110 are disposed in the first organic layer deposition assembly 100-1 along a scanning direction of the substrate 2, so that a plurality of the deposition source nozzles 121 are formed in the first organic layer deposition assembly 100-1 along the scanning direction of the substrate 2. In this case, when the deposition source nozzles 121 are formed in an X-axis direction, distances between the respective deposition source nozzles 121 and respective patterning slits 131 differ from each other, so that shadows occur due to a deposition material that has been discharged from the deposition source nozzle 121 that is distant from the corresponding patterning slit 131. However, in the present embodiment, only one deposition source nozzle 121 is formed in the X-axis direction, and thus the occurrence of shadows may be significantly reduced. Also, since the deposition source nozzles 121 are formed along the scanning direction of the substrate 2, a difference in flux occurring between the deposition source nozzles 121 may be compensated for and deposition uniformity may be maintained constant.

Although not illustrated, in the first organic layer deposition assembly 100-1, two of the three deposition sources 110, which are disposed at both sides of the other one in the middle, may be used to deposit a host material, and the other deposition source 110 disposed in the middle thereof may be used to deposit a dopant material. As described above, the organic layer deposition apparatus 1 according to the present embodiment includes both a deposition source for depositing a host material and a deposition source for depositing a dopant material, and thus, the host material and the dopant material may be co-deposited on the substrate 2, and thus, the manufacturing processes may be simplified and performed fast, and an organic light-emitting display device, including the organic layer deposition apparatus 1, may have an improved efficiency.

Referring to FIG. 6, a deposition source nozzle unit 120' is disposed at a side of the deposition source 110', and in particular, at the side of the deposition source 110' facing the substrate 2. The deposition source nozzle unit 120' includes a plurality of deposition source nozzles 121' arranged along an X-axis direction (i.e., a direction perpendicular to the scanning direction of the substrate 2). In this regard, the plurality of deposition source nozzles 121' may be arranged at equal intervals or at smaller intervals towards both ends thereof. A deposition material that has been vaporized in the deposition source 110' passes through the deposition source nozzles 121' of the deposition source nozzle unit 120' and is then deposited onto the substrate 2. By arranging the plurality of deposition source nozzles 121' along the X-axis direction (i.e., a direction perpendicular to the scanning direction of the substrate 2) so as to form a common layer, a thickness uniformity of the common layer may be improved.

In one embodiment, the patterning slit sheet 130 may be disposed between the deposition source 110 and the substrate 2. The patterning slit sheet 130 may further include a frame 135 having a shape similar to a window frame. The patterning slit sheet 130 includes a plurality of patterning slits 131 arranged in the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

In one embodiment, the deposition source 110 (and the deposition source nozzle unit 120 combined thereto) and the patterning slit sheet 130 may be spaced apart from each other by a certain distance.

As described above, deposition is performed while the organic layer deposition assembly 100-1 is moved relative to the substrate 2. In order for the organic layer deposition assembly 100-1 to be moved relative to the substrate 2, the patterning slit sheet 130 is disposed spaced apart from the substrate 2 by a certain distance.

In a conventional deposition method using an FMM, deposition is performed with the FMM in close contact with a substrate in order to prevent formation of shadows on the substrate. However, when the FMM is formed in close contact with the substrate, defects due to the contact between the substrate and the FMM may occur. In addition, since it is difficult to move the mask with respect to the substrate, the mask and the substrate need to be formed in the same size. Accordingly, the mask needs to be large as the size of a display device increases. However, it is difficult to form a large mask.

To address these problems, in the organic layer deposition assembly 100-1 according to the present embodiment, the patterning slit sheet 130 is formed spaced apart by a certain distance from the substrate 2 on which a deposition material is to be deposited.

According to the present embodiment, deposition may be performed while a mask formed smaller than a substrate is moved with respect to the substrate, and thus, it is easy to manufacture the mask. In addition, defects due to contact between the substrate and the mask may be prevented. In addition, since it is unnecessary to closely contact the substrate with the mask during a deposition process, a manufacturing speed may be improved.

Hereinafter, particular disposition of each element of the upper housing 104 will be described.

The deposition source 110 and the deposition source nozzle unit 120 are disposed on a bottom portion of the upper housing 104. Accommodation portions 104-1 are respectively formed on both sides of the deposition source 100 and the deposition source nozzle unit 120 to have a protruding shape. The first stage 150, the second stage 160, and the patterning slit sheet 130 are sequentially formed on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is disposed on the second stage 160. The patterning slit sheet 130 is disposed on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be disposed between the patterning slit sheet 130 and the deposition source 110. In particular, an anode or cathode pattern is formed on an edge portion of the substrate 2 and is used as a terminal for inspecting a product or in manufacturing a product. If an organic material is applied on a region of the substrate 2, the anode or the cathode can not sufficiently perform its function. Thus, the edge portion of the substrate 2 is formed to be a non-film-forming region on which an organic material or the like is not applied. As described above, however, in the organic layer deposition apparatus, deposition is performed in a scanning manner while the substrate 2 is moved relative to the organic layer deposition apparatus, and thus, it is not easy to prevent the organic material from being deposited on the non-film-forming region of the substrate 2.

Therefore, to prevent the organic material from being deposited on the non-film-forming region of the substrate 2, in the organic layer deposition apparatus, the shielding member 140 may be disposed on the edge portion of the substrate 2. Although not particularly illustrated in FIGS. 3 and 4, the shielding member 140 may include two adjacent plates.

When the substrate 2 does not pass through the organic layer deposition assembly 100-1, the shielding member 140 screens the deposition source 110, and thus, the deposition material 115 discharged from the deposition source 110 does not reach the patterning slit sheet 130. When the substrate 2 enters into the organic layer deposition assembly 100-1 with the shielding member 140 screening the deposition source 110, a front part of the shielding member 140 which screens the deposition source 110 moves along with the movement of the substrate 2, and thus, the flow path of the deposition material 115 is opened and the deposition material 115 discharged from the deposition source 110 passes through the patterning slit sheet 130 and is deposited on the substrate 2. Also, while the substrate 2 is passing through the organic layer deposition assembly 100-1, a rear part of the shielding member 140 moves along with the movement of the substrate 2 to screen the deposition source 110 so that the flow path of the deposition material 115 is closed. Accordingly, the deposition material 115 discharged from the deposition source 110 does not reach the patterning slit sheet 130.

As described above, the non-film-forming region of the substrate 2 is screened by the shielding member 140, and thus, it may be easy to prevent the organic material from being deposited on the non-film-forming region of the substrate 2 without using a separate structure.

Hereinafter, the conveyer unit 400 that conveys the substrate 2, on which the deposition material 115 is to be deposited, is described in more detail. Referring to FIGS. 3, 4, and 7, the conveyer unit 400 includes the first conveyer unit 410, the second conveyer unit 420, and the transfer unit 430.

The first conveyer unit 410 conveys in an in-line manner the transfer unit 430, including the carrier 431 and an electrostatic chuck 432 attached thereto, and the substrate 2 attached to the transfer unit 430 so that an organic layer may be formed on the substrate 2 by the organic layer deposition assembly 100-1. The first conveyer unit 410 includes a coil 411, guide members 412, upper magnetically suspended bearings 413, side magnetically suspended bearings 414, and gap sensors 415 and 416.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed along the first conveyer unit 410 and the second conveyer unit 420 and the electrostatic chuck 432 that is combined on a surface of the carrier 431 and to which the substrate 2 is attached.

Hereinafter, each element of the conveyer unit 400 will be described in more detail.

Referring to FIG. 7, the carrier 431 of the transfer unit 430 will now be described in detail.

The carrier 431 includes a main body part 431*a*, a magnetic rail 431*b*, contactless power supply (CPS) modules 431*c*, a power supply unit 431*d*, and guide grooves 431*e*.

The main body part 431*a* constitutes a base part of the carrier 431 and may be formed of a magnetic material such as iron. In this regard, due to a repulsive force between the main body part 431*a* and the respective upper and side magnetically suspended bearings 413 and 414, which are described below, the carrier 431 may be maintained spaced apart from the guide members 412 by a certain distance.

The guide grooves 431*e* may be respectively formed at both sides of the main body part 431*a* and each may accommodate a guide protrusion 412*e* of the guide member 412.

The magnetic rail 431*b* may be formed along a center line of the main body part 431*a* in a direction where the main body part 431*a* proceeds. The magnetic rail 431*b* of the main body part 431*a* and the coil 411, which are described below in more detail, may be combined with each other to constitute a linear motor, and the carrier 431 may be conveyed in an arrow A direction by the linear motor.

The CPS modules 431*c* and the power supply unit 431*d* may be respectively formed on both sides of the magnetic rail 431*b* in the main body part 431*a*. The power supply unit 431*d* includes a battery (e.g., a rechargeable battery) that provides power so that the electrostatic chuck 432 can chuck the substrate 2 and maintains operation. The CPS modules 431*c* are wireless charging modules that charge the power supply unit 431*d*. In particular, the charging track 423 formed in the second conveyer unit 420, which are described below, is connected to an inverter (not shown), and thus, when the carrier 431 is transferred into the second conveyer unit 420, a magnetic field is formed between the charging track 423 and the CPS modules 431*c* so as to supply power to the CPS module 431*c*. The power supplied to the CPS modules 431*c* is used to charge the power supply unit 431*d*.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

Hereinafter, an operation of the transfer unit 430 is described in more detail.

The magnetic rail 431*b* of the main body part 431*a* and the coil 411 may be combined with each other to constitute an operation unit. In this regard, the operation unit may be a linear motor. The linear motor has a small frictional coefficient, little position error, and a very high degree of position determination, as compared to a conventional slide guide system. As described above, the linear motor may include the coil 411 and the magnetic rail 431*b*. The magnetic rail 431*b* is linearly disposed on the carrier 431, and a plurality of the coils 411 may be disposed at an inner side of the chamber 101 by a certain distance so as to face the magnetic rail 431*b*. Since the magnetic rail 431*b* is disposed on the carrier 431 instead of the coil 411, the carrier 431 may be operable without power being supplied thereto. In this regard, the coil 411 may be formed in an atmosphere (ATM) box in an air atmosphere, and the carrier 431 to which the magnetic rail 431*b* is attached may be moved in the chamber 101 maintained in vacuum.

The organic layer deposition assembly 100-1 of the organic layer deposition apparatus 1 according to the present embodiment may further include the gap measuring unit 170 for an aligning process. In more detail, the gap measuring unit 170 may measure a gap between the substrate 2 and the patterning slit sheet 130. Here, the gap measuring unit 170 is arranged to achieve a visual field in the chamber 101 in which the deposition process proceeds. To do so, the gap measuring unit 170 may be installed in an air atmosphere while formed in a gap measuring unit-housing unit 171.

Figure 8:
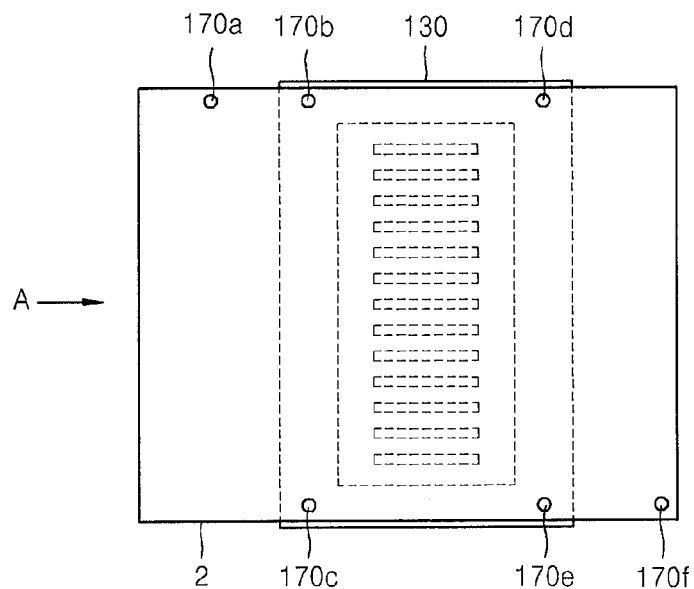
FIG. 8 is a schematic plane view of a gap measuring unit, a substrate, and a patterning slit sheet, according to an embodiment of the present invention.

FIG. 8 is a schematic plane view of the gap measuring unit 170, the substrate 2, and the patterning slit sheet 130.

Referring to FIG. 8, the gap measuring unit 170 may include first gap measuring parts and second measuring parts.

The first gap measuring parts may not be disposed on the patterning slit sheet 130 but may be disposed on a virtual plane (virtual patterning slit sheet) 130' that extends from the patterning slit sheet 130. The second measuring parts may be disposed on the patterning slit sheet 130.

The first gap measuring parts may include a first gap measuring unit 170*a* and a sixth gap measuring unit 170*f*. However, aspects of the present invention are not limited thereto, and thus the first gap measuring parts may include two or more gap measuring units. The second measuring parts may include a second gap measuring unit 170*b*, a third gap measuring unit 170*c*, a fourth gap measuring unit 170*d*, and a fifth gap measuring unit 170*e*. However, aspects of the present invention are not limited thereto, and thus the second gap measuring parts may include four or more gap measuring units.

In more detail, the first gap measuring unit 170*a*, the second gap measuring unit 170*b*, and the fourth gap measuring unit 170*d* may be disposed on a first virtual line, and the third gap measuring unit 170*c*, the fifth gap measuring unit 170*e*, and the sixth gap measuring unit 170*f* may be disposed on a second virtual line. Here, the first virtual line and the second virtual line may be in parallel with a first direction A.

Also, the first gap measuring unit 170*a*, the second gap measuring unit 170*b*, and the third gap measuring unit 170*c* may be disposed in such a manner that virtual lines that connect them form a triangle. Also, the fourth gap measuring unit 170*d*, the fifth gap measuring unit 170*e*, and the sixth gap measuring unit 170*f* may be disposed in such a manner that virtual lines that connect them form a triangle.

Figure 9:
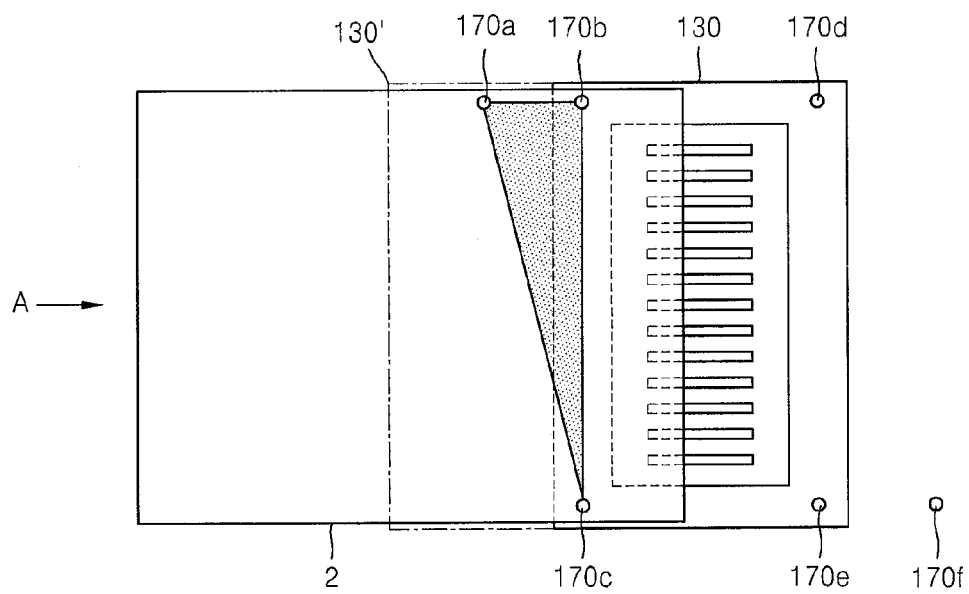
FIGS. 9 through 11 are plane views illustrating processes of measuring a distance between the substrate and the patterning slit sheet by using the gap measuring unit, according to an embodiment of the present invention.
Figure 11:
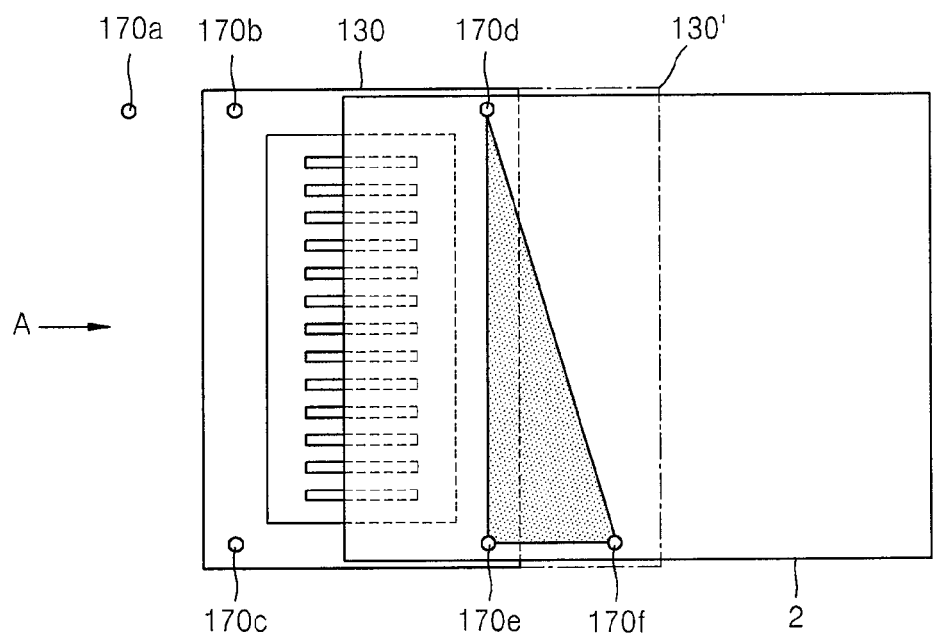

As illustrated in FIG. 9, the virtual lines that connect the first gap measuring unit 170*a*, the second gap measuring unit 170*b*, and the third gap measuring unit 170*c* may form an equilateral triangle. As illustrated in FIG. 11, the virtual lines that connect the fourth gap measuring unit 170*d*, the fifth gap measuring unit 170*e*, and the sixth gap measuring unit 170*f* may form an equilateral triangle.

That is, the virtual line that connects the first gap measuring unit 170*a* and the second gap measuring unit 170*b* may be a first side, the virtual line that connects the second gap measuring unit 170*b* and the third gap measuring unit 170*c* may be a second side, and the virtual line that connects the third gap measuring unit 170*c* and the first gap measuring unit 170*a* may be a third side, and in this regard, the first side and the second side may be perpendicular to each other, and the third side may correspond to a slant side (hypotenuse) of the triangle, so that the triangle formed by the first gap measuring unit 170*a*, the second gap measuring unit 170*b*, and the third gap measuring unit 170*c* may be a right-angled triangle.

Also, the virtual line that connects the fifth gap measuring unit 170e and the sixth gap measuring unit 170f may be a fourth side, the virtual line that connects the fourth gap measuring unit 170d and the fifth gap measuring unit 170e may be a fifth side, and the virtual line that connects the sixth gap measuring unit 170f and the fourth gap measuring unit 170d may be a sixth side, and in this regard, the fourth side and the fifth side may be perpendicular to each other, and the sixth side may correspond to a slant side (hypotenuse) of the triangle, so that the triangle formed by the fourth gap measuring unit 170d, the fifth gap measuring unit 170e, and the sixth gap measuring unit 170f may be a right-angled triangle.

The first through sixth gap measuring units 170a through 170f may be confocal sensors. The confocal sensor may scan a measurement target by using a laser beam and a scanning mirror that rotates with a high speed and may measure a distance to the measurement target by using a fluorescent ray or a reflective ray emitted from the laser beam. The confocal sensor may measure a distance by sensing an interface between different mediums.

Figure 10:
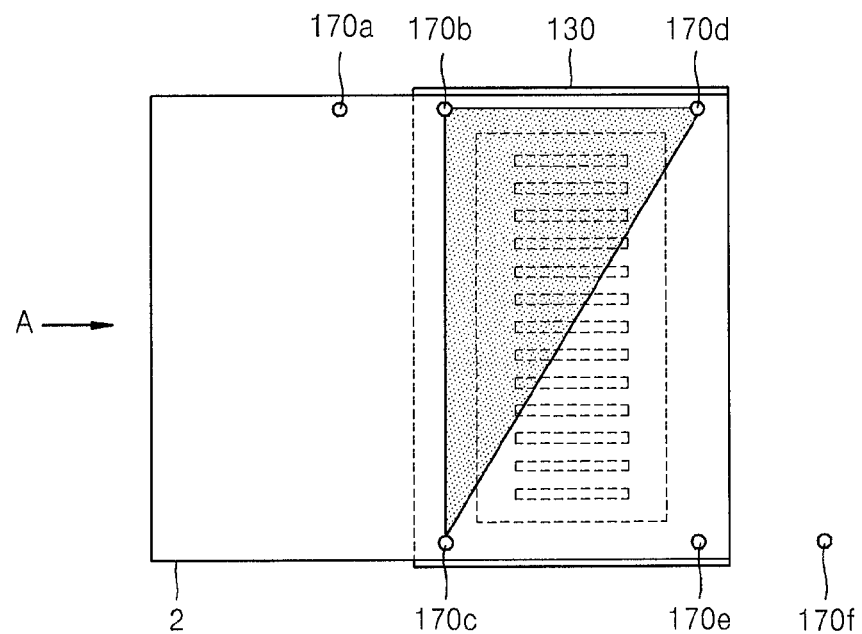

FIGS. 9 through 11 are plane views illustrating processes of measuring a distance between the substrate 2 and the patterning slit sheet 130 by using the gap measuring unit 170.

FIG. 9 illustrates an example in which the substrate 2 moves in the first direction A and thus is positioned below the first gap measuring unit 170a, the second gap measuring unit 170b, and the third gap measuring unit 170c.

Referring to FIG. 9, the first gap measuring unit 170a may measure a distance to the substrate 2, and each of the second gap measuring unit 170b and the third gap measuring unit 170c may measure a distance to the substrate 2 and a distance to the patterning slit sheet 130. Also, a distance between the substrate 2 and the patterning slit sheet 130 may be measured from each of the first gap measuring unit 170a, the second gap measuring unit 170b, and the third gap measuring unit 170c. That is, the distance between the substrate 2 and the patterning slit sheet 130 may be obtained by subtracting the distance to the substrate 2 from the distance to the patterning slit sheet 130.

The first gap measuring unit 170a may obtain the distance between the substrate 2 and the patterning slit sheet 130 by using the distance to the patterning slit sheet 130, which is measured by the second gap measuring unit 170b or the third gap measuring unit 170c, as a distance between the first gap measuring unit 170a and a virtual patterning slit sheet that is the virtual plane 130'. The virtual patterning slit sheet 130' may refer to a plane that extends from the patterning slit sheet 130. The distance to the virtual patterning slit sheet 130' may correspond to the distance to the patterning slit sheet 130 which is measured by the second gap measuring unit 170b.

If the distances between the substrate 2 and the patterning slit sheet 130 which are measured by the first gap measuring unit 170a, the second gap measuring unit 170b, and the third gap measuring unit 170c are different from each other, the patterning slit sheet 130 may be moved to synchronize the distances. This will be described below in more detail.

FIG. 10 illustrates an example in which the substrate 2 moves in the first direction A and thus is positioned below the second gap measuring unit 170b, the third gap measuring unit 170c, and the fifth gap measuring unit 170e.

Referring to FIG. 10, each of the second gap measuring unit 170b, the third gap measuring unit 170c, and the fifth gap measuring unit 170e may measure a distance to the substrate 2 and a distance to the patterning slit sheet 130 and thus may obtain a distance between the substrate 2 and the patterning slit sheet 130 at each of positions of the second gap measuring unit 170b, the third gap measuring unit 170c, and the fifth gap measuring unit 170e. As described above, the distance between the substrate 2 and the patterning slit sheet 130 may be obtained by subtracting the distance to the substrate 2 from the distance to the patterning slit sheet 130.

If the distances between the substrate 2 and the patterning slit sheet 130 which are measured by the second gap measuring unit 170b, the third gap measuring unit 170c, and the fifth gap measuring unit 170e are different from each other, the patterning slit sheet 130 may be moved, so that the distance between the substrate 2 and the patterning slit sheet 130 may be constant (be the same throughout the patterning slit sheet 130).

Figure 12:
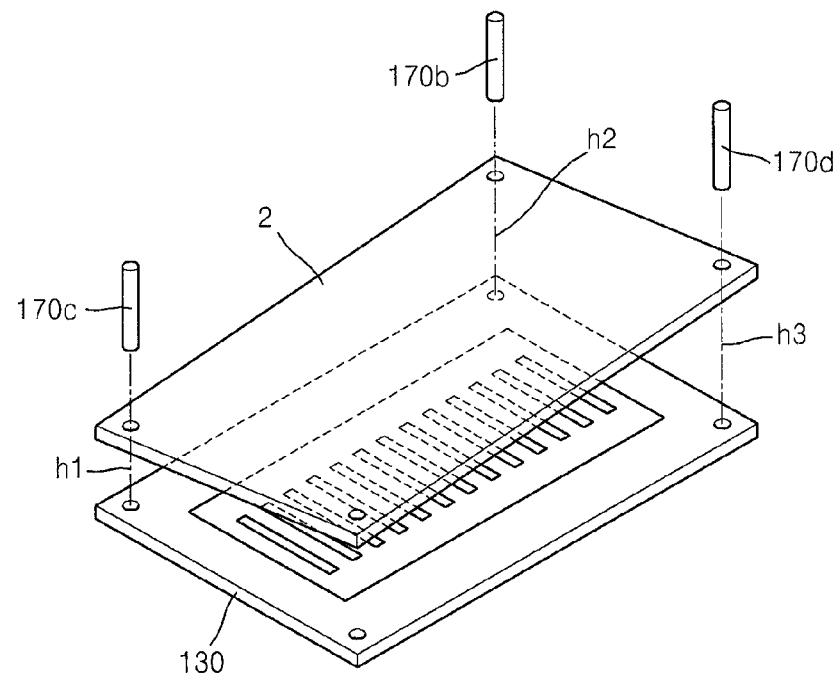
FIGS. 12 and 13 are perspective views, each illustrating a distance between the substrate and the patterning slit.
Figure 13:
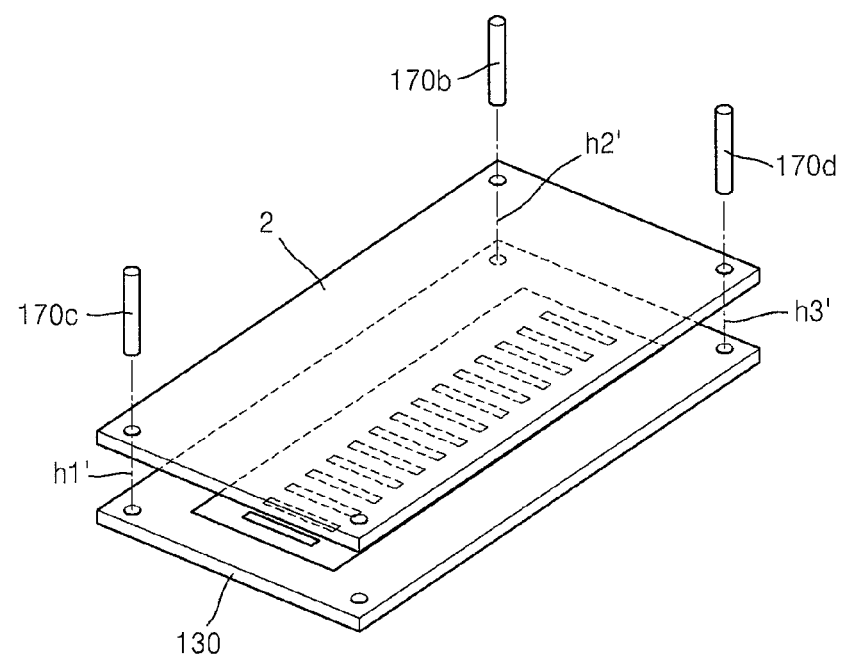

In more detail, FIGS. 12 and 13 illustrate arrangement of the substrate 2 and the patterning slit sheet 130. FIG. 12 illustrates a status in which the substrate 2 and the patterning slit sheet 130 are not aligned, and FIG. 13 illustrates a status in which the substrate 2 and the patterning slit sheet 130 are aligned. Referring to FIG. 12, when the substrate 2 moves and thus is above the patterning slit sheet 130, each of the second gap measuring unit 170b, the third gap measuring unit 170c, and the fifth gap measuring unit 170e may measure a distance to the substrate 2 and a distance to the patterning slit sheet 130, and thus the second gap measuring unit 170b, the third gap measuring unit 170c, and the fifth gap measuring unit 170e may measure respective distances h1, h2, and h3 between the substrate 2 and the patterning slit sheet 130 at respective measurement points. As illustrated in FIG. 12, the distances h1, h2, and h3 between the substrate 2 and the patterning slit sheet 130 may differ from each other. In this case, the first stage 150 and the second stage 160 may tilt, rotate, and/or move the patterning slit sheet 130, so that, as illustrated in FIG. 13, distances h1', h2', and h3' between the substrate 2 and the patterning slit sheet 130 may be constant (the same).

FIG. 11 illustrates an example in which the substrate 2 moves in the first direction A and thus is positioned below the fourth gap measuring unit 170d, the fifth gap measuring unit 170e, and the sixth gap measuring unit 170f.

Referring to FIG. 11, the sixth gap measuring unit 170f may measure a distance to the substrate 2, and each of the fourth gap measuring unit 170d and the fifth gap measuring unit 170e may measure a distance to the substrate 2 and a distance to the patterning slit sheet 130. Also, a distance between the substrate 2 and the patterning slit sheet 130 may be measured from each of the fourth gap measuring unit 170d, the fifth gap measuring unit 170e, and the sixth gap measuring unit 170f. That is, the distance between the substrate 2 and the patterning slit sheet 130 may be obtained by subtracting the distance to the substrate 2 from the distance to the patterning slit sheet 130.

The sixth gap measuring unit 170f may obtain the distance between the substrate 2 and the patterning slit sheet 130 by using the distance to the patterning slit sheet 130, which is measured by the fourth gap measuring unit 170d or the fifth gap measuring unit 170e, as a distance between sixth gap measuring unit 170f and a virtual patterning slit sheet 130'. The virtual patterning slit sheet 130' may refer to a plane that extends from the patterning slit sheet 130. The distance to the virtual patterning slit sheet 130' may correspond to the distance to the patterning slit sheet 130 which is measured by the fourth gap measuring unit 170d or the fifth gap measuring unit 170e.

If the distances between the substrate 2 and the patterning slit sheet 130 which are measured by the fourth gap measuring unit 170d, the fifth gap measuring unit 170e, and the sixth gap measuring unit 170f are different from each other, the patterning slit sheet 130 may be moved to synchronize the distances.

In this manner, since a distance between the substrate 2 and the patterning slit sheet 130 is measurable in real time by using the gap measuring unit 170, the substrate 2 may be aligned with the patterning slit sheet 130 in real time, whereby position accuracy of a pattern may be significantly improved.

Figure 14:
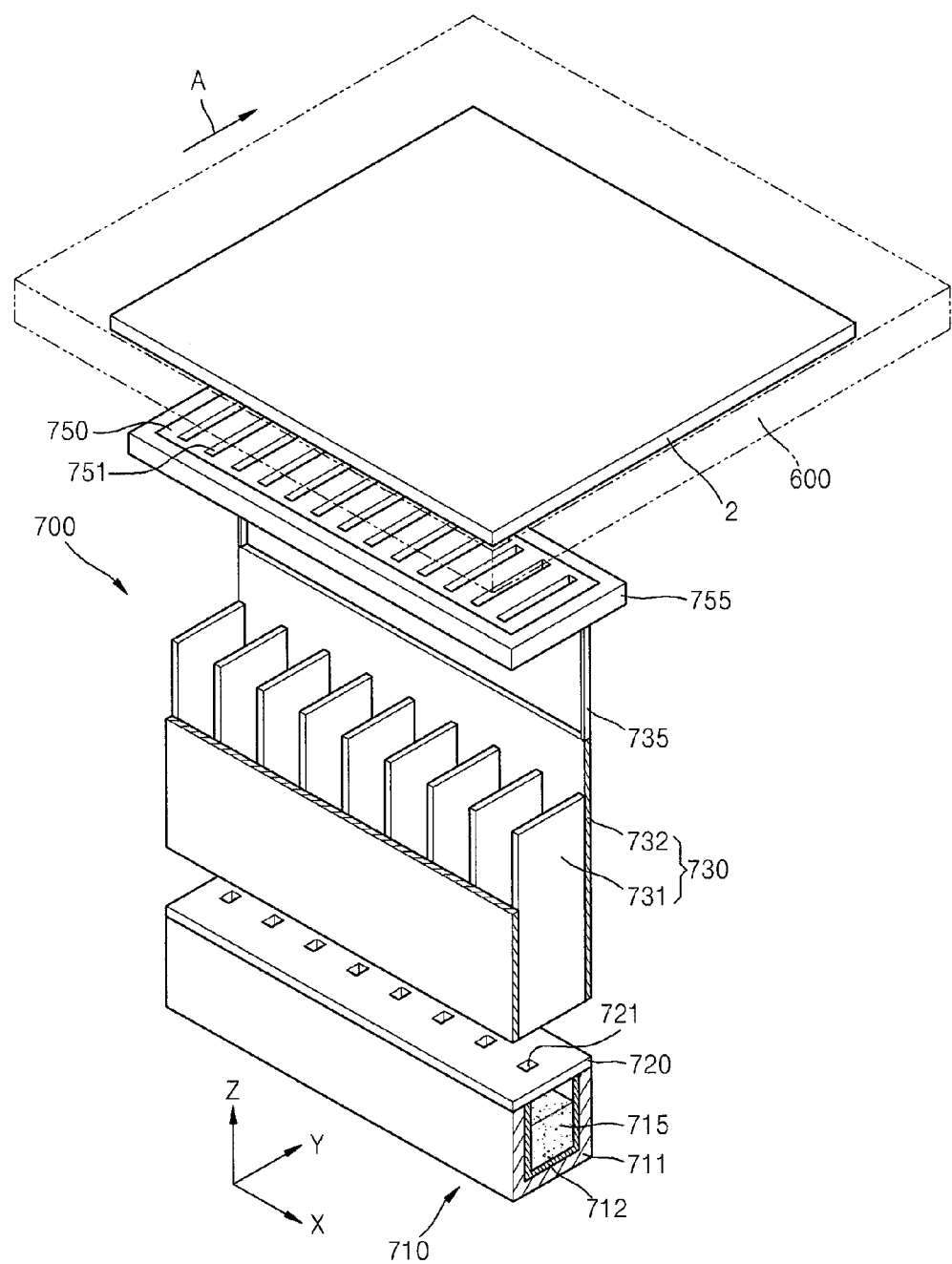
FIG. 14 is a schematic perspective view of an organic layer deposition assembly according to another embodiment of the present invention.
Figure 15:
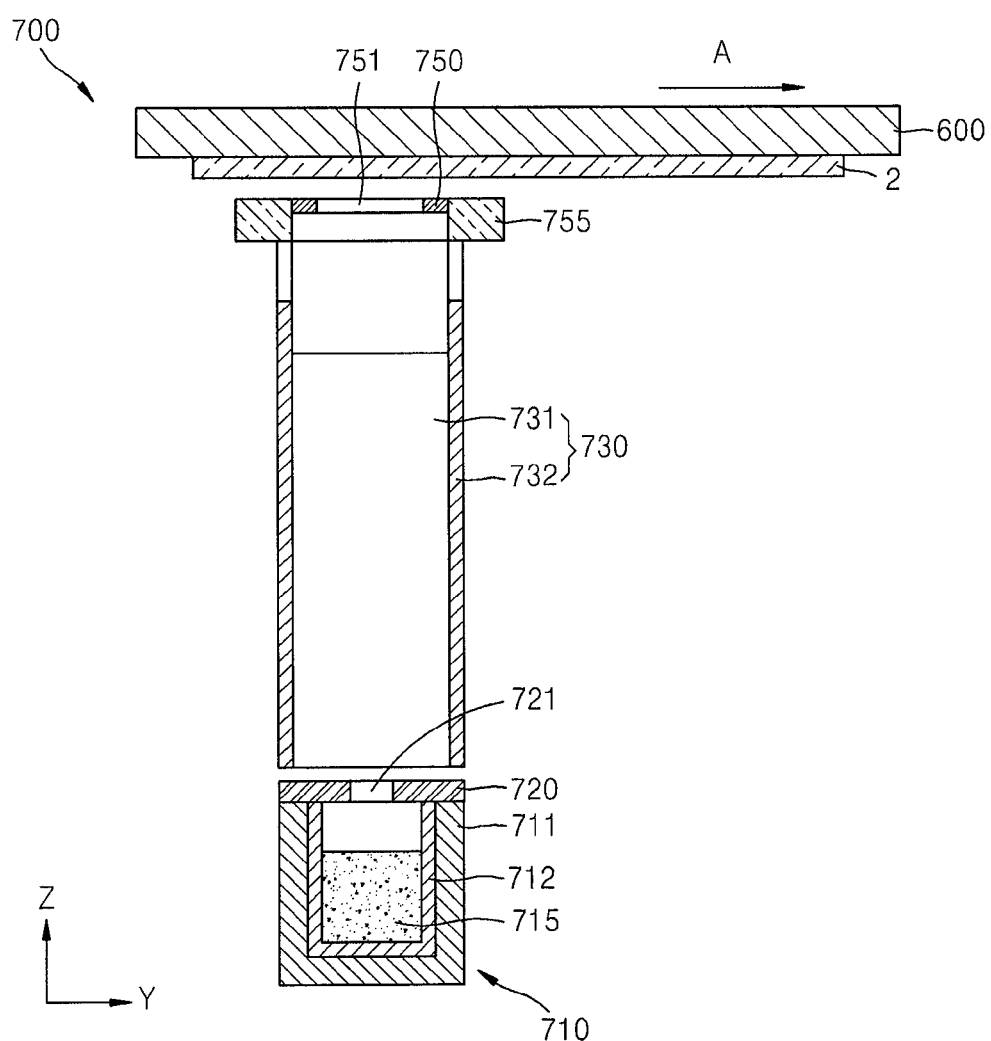
FIG. 15 is a cross-sectional side view of the organic layer deposition assembly of FIG. 14.
Figure 16:
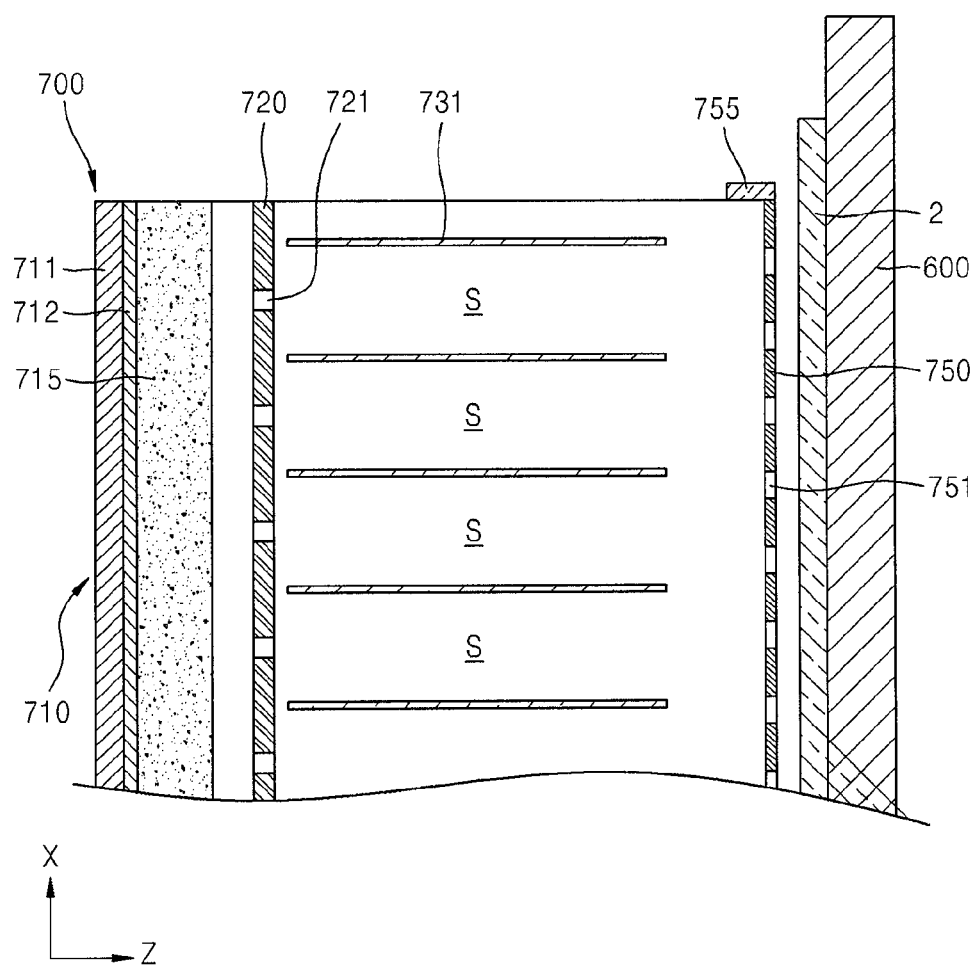
FIG. 16 is a cross-sectional plan view of the organic layer deposition assembly of FIG. 14.

FIG. 14 is a schematic perspective view of an organic layer deposition assembly 700 according to an embodiment of the present invention. FIG. 15 is a cross-sectional side view of the organic layer deposition assembly 700 of FIG. 14. FIG. 16 is a cross-sectional plan view of the organic layer deposition assembly 700 of FIG. 14.

Referring to FIGS. 14 through 16, the organic layer deposition assembly 700 includes a deposition source 710, a deposition source nozzle unit 720, a shielding plate assembly 730, and a patterning slit sheet 750.

The deposition source 710 includes a crucible 711 that is filled with the deposition material 715 and a heater 712 that heats the crucible 711 so as to vaporize the deposition material 715 included in the crucible 711 toward the deposition source nozzle unit 720. The deposition source nozzle unit 720 is disposed at a side of the deposition source 710, and a plurality of deposition source nozzles 721 are formed on the deposition source nozzle unit 720 along the X-axis direction.

The shielding plate assembly 730 is arranged at a side of the deposition source nozzle unit 720. The shielding plate assembly 730 includes a plurality of shielding plates 731 and a shielding plate frame 732 disposed on an outer side of the shielding plates 731. The shielding plates 731 may be disposed in parallel to each other along the X-axis direction. Here, the shielding plates 731 may be disposed at regular intervals. Also, each of the shielding plates 731 may extend along Y-Z planes and may have a rectangular shape. The shielding plates 731 that are disposed in the aforementioned manner define a space between the deposition source nozzle unit 720 and the patterning slit sheet 750 into a plurality of deposition spaces S, so that a deposition material that is exhausted from one deposition source nozzle 721 is not mixed with deposition materials that are exhausted from other deposition source nozzles 721, but passes through the patterning slit 751 and then is deposited onto the substrate 2. That is, each of the shielding plates 731 functions to guide a movement path of the deposition material, so that the deposition material exhausted from each of the deposition source nozzles 721 goes straight in a Z-axis direction without spreading.

As described above, a linearity of the deposition material is achieved by arrangement of the shielding plates 731, so that a size of shadows formed on the substrate 2 may be significantly reduced, and thus the organic layer deposition assembly 700 and the substrate 2 may be spaced apart from each other by a certain distance.

The patterning slit sheet 750 is further disposed between the deposition source 710 and the substrate 2. The patterning slit sheet 750 further includes a frame 755 having a shape similar to a window frame. Also, the patterning slit sheet 750 includes a plurality of patterning slits 751 arranged in an X-axis direction. The deposition material 715 that is vaporized in the deposition source 710 passes through the deposition source nozzle unit 720 and the patterning slit sheet 750 and then moves toward the substrate 2 that is a deposition target.

Figure 17:
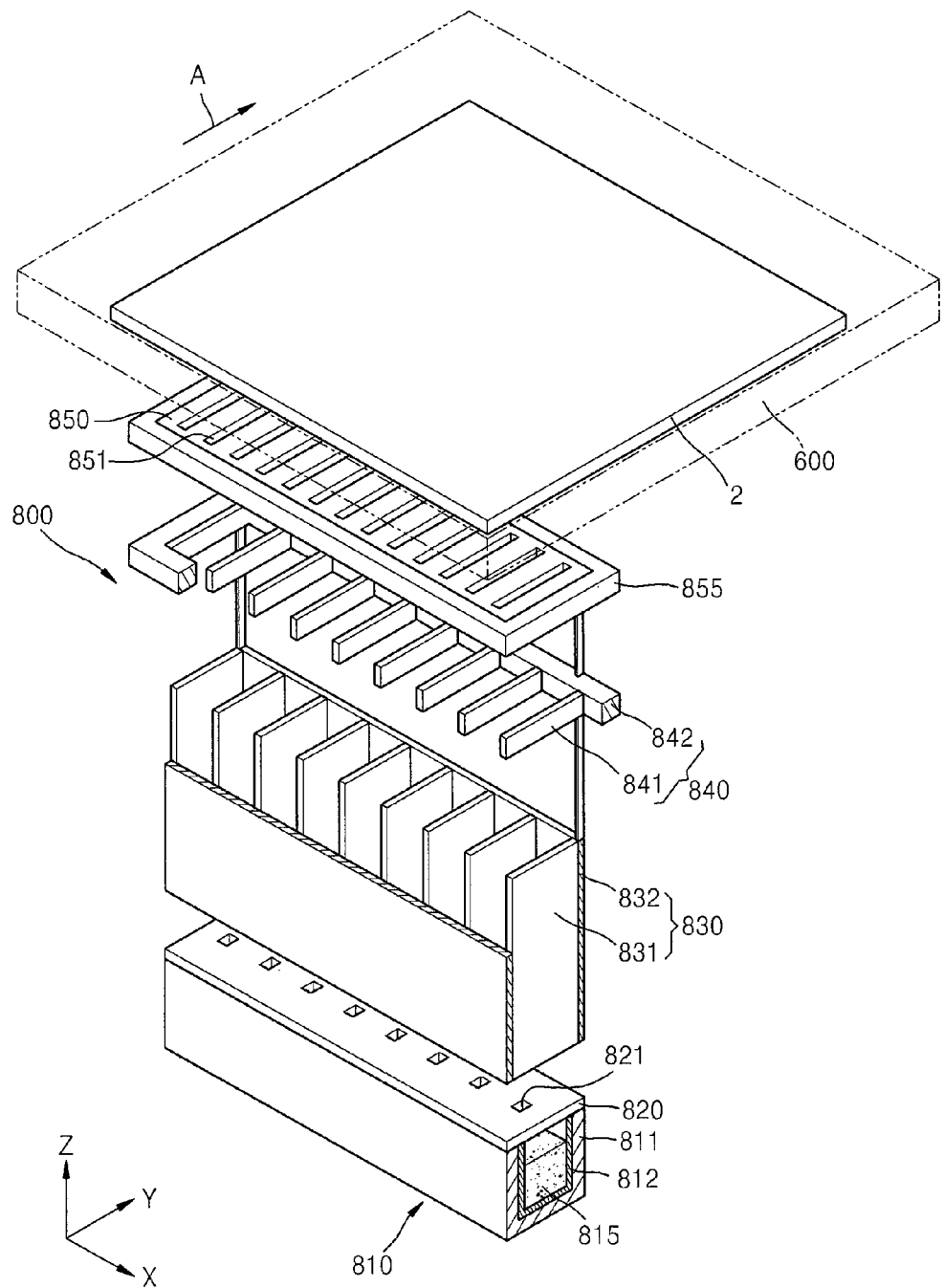
FIG. 17 is a schematic perspective view of an organic layer deposition assembly according to another embodiment of the present invention.

FIG. 17 is a schematic perspective view of an organic layer deposition assembly 800 according to another embodiment of the present invention.

Referring to FIG. 17, the organic layer deposition assembly 800 includes a deposition source 810, a deposition source nozzle unit 820, a first shielding plate assembly 830, a second shielding plate assembly 840, and a patterning slit sheet 850. Here, configurations of the deposition source 810, the first shielding plate assembly 830, and the patterning slit sheet 850 are the same as those described above with reference to FIG. 14, thus, detailed descriptions thereof are omitted. The present embodiment is different from the previous embodiments in that the second shielding plate assembly 840 is arranged at a side of the first shielding plate assembly 830.

In more detail, the second shielding plate assembly 840 includes a plurality of second shielding plates 841 and a second shielding plate frame 842 disposed on an outer side of the second shielding plates 841. The second shielding plates 841 may be disposed in parallel with each other along the X-axis direction. Also, the second shielding plates 841 may be disposed at regular intervals. Also, each of the second shielding plates 841 may extend along Y-Z planes, i.e., may be perpendicular to the X-axis direction.

A plurality of first shielding plates 831 and the second shielding plates 841, which are disposed in the aforementioned manner, define a space between the deposition source nozzle unit 820 and the patterning slit sheet 850. That is, the present embodiment is characterized in that deposition spaces are defined respectively with respect to a plurality of deposition source nozzles 821 that spray deposition material, due to the first shielding plates 831 and the second shielding plates 841.

Here, the first shielding plates 831 and the second shielding plates 841 may be disposed to correspond to each other. In other words, the first shielding plates 831 may align with the second shielding plates 841, respectively, and thus may be in parallel with each other. That is, the first shielding plate 831 and the second shielding plate 841 that correspond to each other may be positioned on the same plane. Referring to FIG. 17, a length of each first shielding plate 831 is equal to an X-axis direction width of each second shielding plate 841 but aspects of the present invention are not limited thereto. That is, the second shielding plates 841 that are required to be accurately aligned with the adjacent patterning slits 851 may be relatively thin whereas the first shielding plates 831 that are not accurately aligned with the adjacent patterning slits 851 may be relatively thick for ease of manufacturing.

Figure 18:
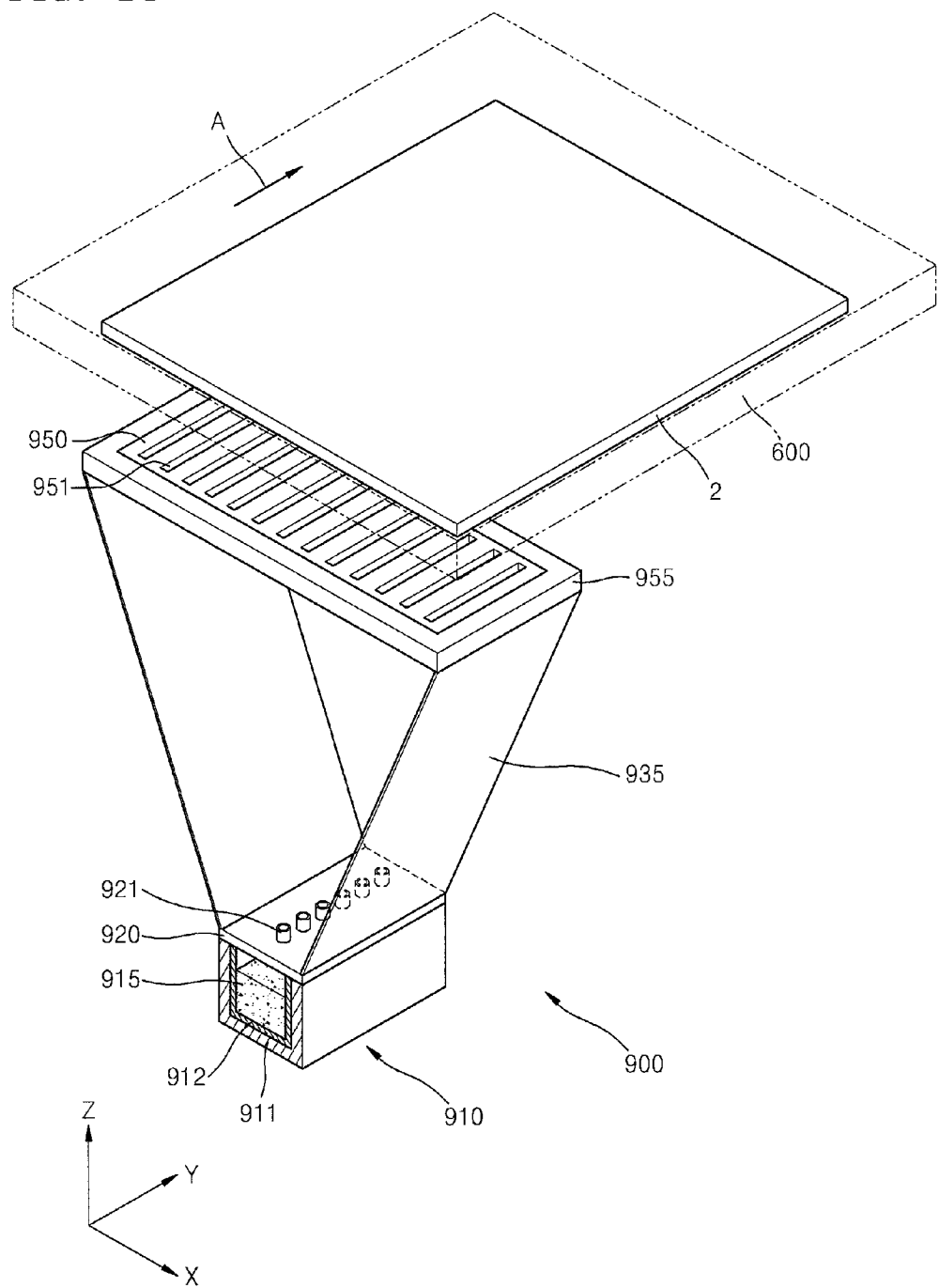
FIG. 18 is a schematic perspective view of an organic layer deposition assembly according to another embodiment of the present invention.

FIG. 18 is a schematic perspective view of an organic layer deposition assembly 900 according to another embodiment of the present invention.

Referring to FIG. 18, the organic layer deposition assembly 900 includes a deposition source 910, a deposition source nozzle unit 920, and a patterning slit sheet 950.

The deposition source 910 includes a crucible 911 that is filled with a deposition material 915 and a heater 912 that heats the crucible 911 so as to vaporize a deposition material 915 included in the crucible 911 toward the deposition source nozzle unit 920. The deposition source nozzle unit 920 is disposed at a side of the deposition source 910, and a plurality of deposition source nozzles 921 are formed on the deposition source nozzle unit 920 along a Y-axis direction. Also, the patterning slit sheet 950 and a frame 955 are further disposed between the deposition source 910 and the substrate 2, and a plurality of patterning slits 951 and spacers 952 are formed at the patterning slit sheet 950 along an X-axis direction. The deposition source 910 and the deposition source nozzle unit 920, and the patterning slit sheet 950 are combined by using connection members 935.

The present embodiment is different from the previous embodiments in that arrangements of the deposition source nozzles 921 at the deposition source nozzle unit 920 are changed. Hereinafter, the difference is described as below.

The deposition source nozzle unit 920 is disposed at a side of the deposition source 910 so as face the substrate 2. The deposition source nozzles 921 are formed on the deposition source nozzle unit 920 along the Y-axis direction, i.e., along a scanning direction of the substrate 2. Here, the deposition source nozzles 921 may be disposed at regular intervals. The deposition material 915 that has been vaporized in the deposition source 910 passes through the deposition source nozzle unit 920 and then moves toward the substrate 2 that is a deposition target. As a result, in the organic layer deposition assembly 900, the deposition source nozzles 921 are formed along the scanning direction of the substrate 2. In this regard, when the deposition source nozzles 921 are formed in the X-axis direction, distances between the respective deposition source nozzles 921 and the respective patterning slits 951 differ from each other, so that shadows occur due to a deposition material that has been discharged from the deposition source nozzle 921 that is distant from the corresponding patterning slit 951. Thus, in the present embodiment, only one deposition source nozzle 921 is formed in the X-axis direction, and thus the occurrence of shadows may be significantly reduced. Also, since the deposition source nozzles 921 are formed along the scanning direction of the substrate 2, a difference in flux occurring between the deposition source nozzles 121 may be compensated for and deposition uniformity may be maintained constant.

Hereinafter, a structure of an organic layer formed by using the organic layer deposition apparatus 1 is described in more detail.

Figure 19:
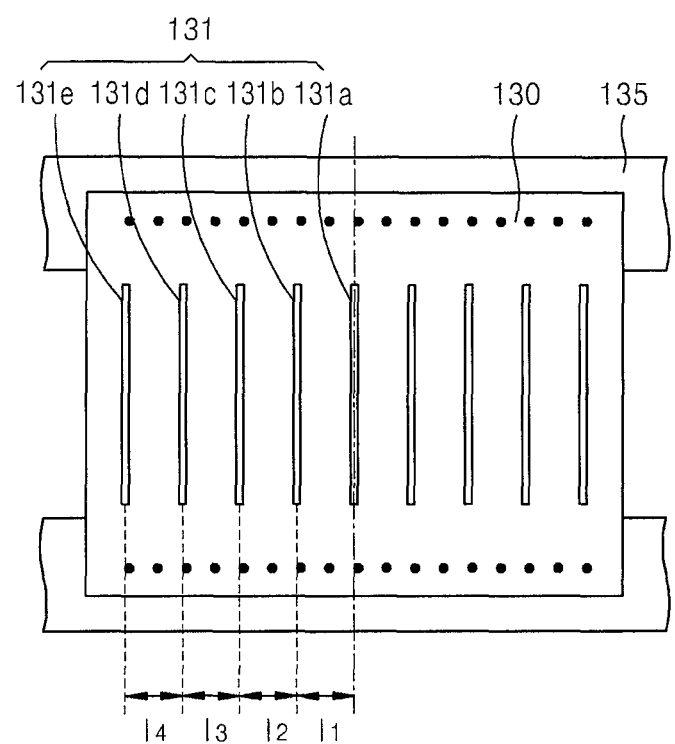
FIG. 19 is a diagram illustrating a structure in which patterning slits are arranged at equal intervals in the patterning slit sheet of the organic layer deposition apparatus, according to an embodiment of the present invention.
Figure 20:
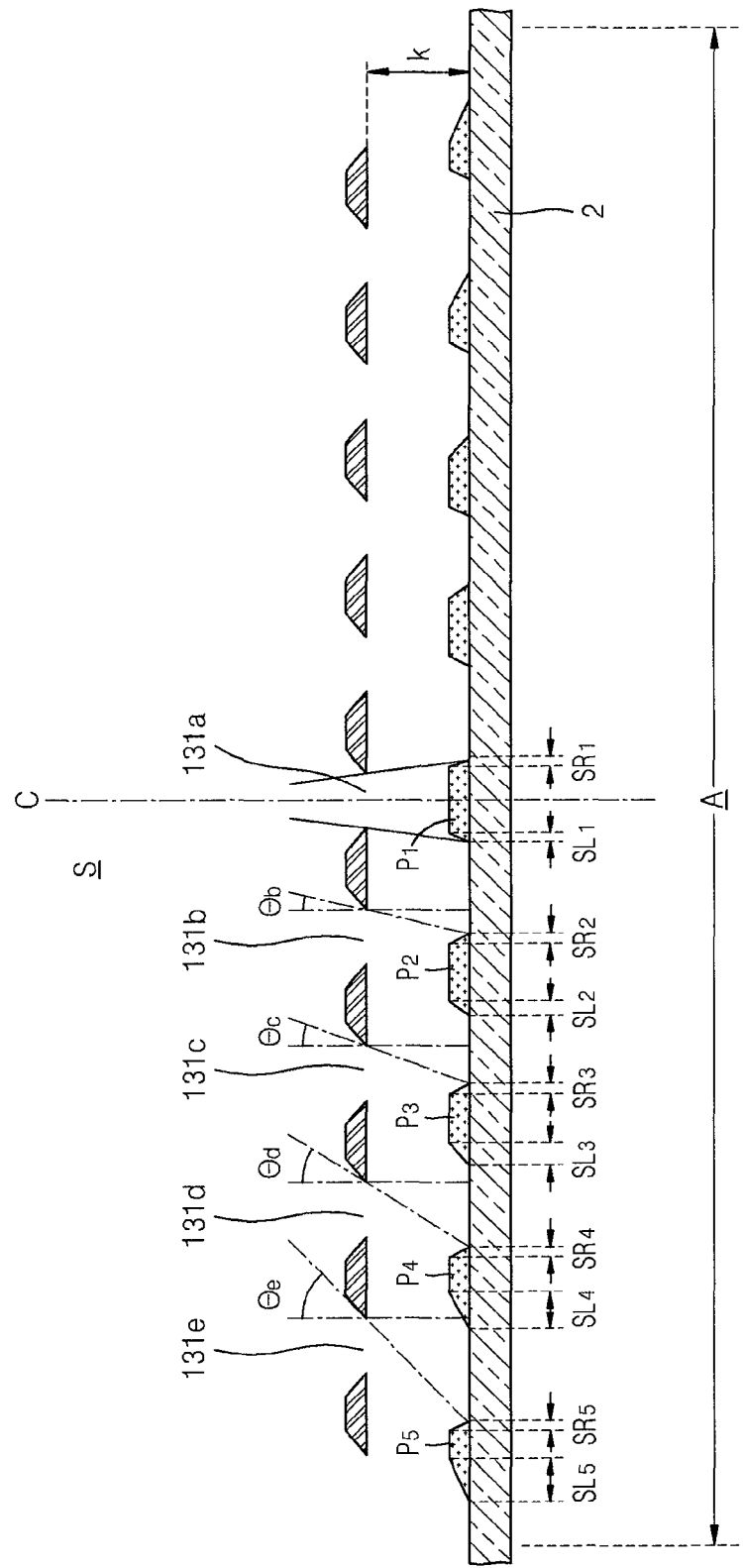
FIG. 20 is a diagram illustrating organic layers formed on the substrate by using the patterning slit sheet of FIG. 19, according to an embodiment of the present invention.

FIG. 19 is a diagram illustrating a structure in which the patterning slits 131 are arranged at equal intervals in the patterning slit sheet 130 of the organic layer deposition apparatus 1, according to an embodiment of the present invention. FIG. 20 is a diagram illustrating organic layers formed on the substrate 2 by using the patterning slit sheet 130 of FIG. 19, according to an embodiment of the present invention.

FIGS. 19 and 20 illustrate the patterning slit sheet 130 in which the patterning slits 131 are arranged at equal intervals. That is, in FIG. 19, the patterning slits 131 satisfy the following condition: $I_1=I_2=I_3=I_4$.

In this embodiment, an incident angle of a deposition material discharged along a center line C of a deposition space S is substantially perpendicular to the substrate 2. Thus, an organic layer $P_1$ formed using the deposition material that has passed through a patterning slit 131a has a minimum size of a shadow, and a right-side shadow $SR_1$ and a left-side shadow $SL_1$ are formed symmetrical to each other.

However, a critical incident angle θ of the deposition material that passes through patterning slits disposed farther from the center line C of the deposition space S gradually increases, and thus, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. In particular, a left-side shadow $SR_5$ is larger than a right-side shadow $SR_5$.

That is, as the critical incident angle θ of the deposition material increases, the size of the shadow also increases. In particular, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits disposed farther from the center line C of the deposition space S have a larger shadow size. In particular, of the shadows on both sides of the respective organic layers, the size of the shadow at a position farther from the center line C of the deposition space S is larger than that of the other.

That is, referring to FIG. 20, the organic layers formed on the left side of the center line C of the deposition space S have a structure in which a left hypotenuse (left slanted side) is larger than a right hypotenuse (right slanted side), and the organic layers formed on the right side (right slanted side) of the center line C of the deposition space S have a structure in which a right hypotenuse is larger than a left hypotenuse (left slanted side).

Also, in the organic layers formed on the left side of the center line C of the deposition space S, the length of the left hypotenuse increases towards the left. In the organic layers formed on the right side of the center line C of the deposition space S, the length of the right hypotenuse increases towards the right. Consequently, the organic layers formed in the deposition space S may be formed symmetrical to each other about the center line C of the deposition space S.

This structure will now be described in more detail.

The deposition material that passes through a patterning slit 131b passes through the patterning slit 131b at a critical incident angle of $θ_b$, and an organic layer $P_2$ formed using the deposition material that has passed through the patterning slit 131b has a left-side shadow having a size of $SL_2$. Similarly, the deposition material that passes through a patterning slit 131c passes through the patterning slit 131c at a critical incident angle of $θ_c$, and an organic layer $P_3$ formed using the deposition material that has passed through the patterning slit 131c has a left-side shadow having a size of $SL_3$. Similarly, the deposition material that passes through a patterning slit 131d passes through the patterning slit 131d at a critical incident angle of $θ_d$, and an organic layer $P_4$ formed using the deposition material that has passed through the patterning slit 131d has a left-side shadow having a size of $SL_4$. Similarly, the deposition material that passes through the patterning slit 131e passes through the patterning slit 131e at a critical incident angle of $θ_e$, and an organic layer $P_5$ formed using the deposition material that has passed through the patterning slit 131e has a left-side shadow having a size of $SL_5$.

In this regard, the critical incident angles satisfy the following condition: $θ_b<θ_c<θ_d<θ_e$, and thus, the sizes of the shadows of the organic layers also satisfy the following condition: $SL_1<SL_2<SL_3<SL_4<SL_5$.

Figure 21:
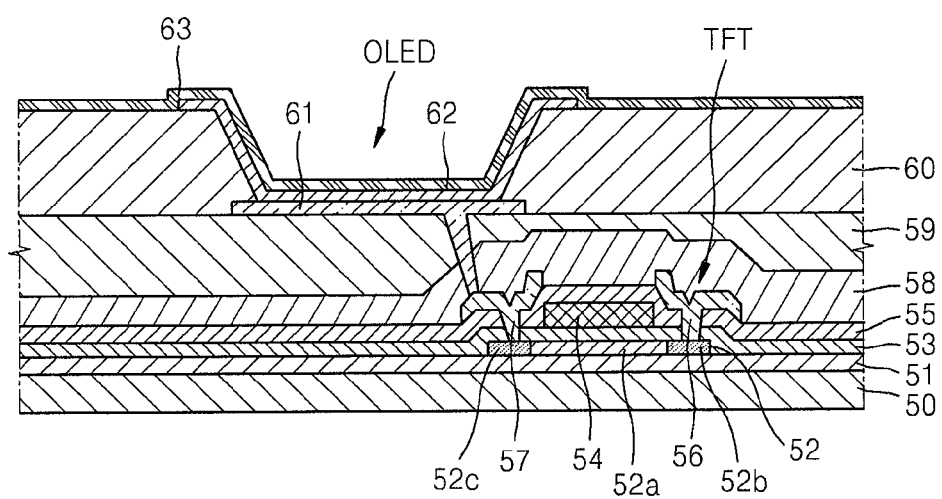
FIG. 21 is a cross-sectional view of an active matrix-type organic light-emitting display device manufactured using the organic layer deposition apparatus, according to an embodiment of the present invention.

FIG. 21 is a cross-sectional view of an active matrix-type organic light-emitting display device manufactured using the organic layer deposition apparatus 1, according to an embodiment of the present invention.

Referring to FIG. 21, the active matrix organic light-emitting display device according to the current embodiment is formed on the substrate 50. The substrate 2 may be formed of a transparent material, for example, glass, plastic, or metal. An insulating layer 51, such as a buffer layer, is formed on an entire surface of the substrate 2.

A thin film transistor (TFT), a capacitor, and an organic light-emitting diode (OLED) are disposed on the insulating layer 51, as illustrated in FIG. 21.

A semiconductor active layer 52 is formed on an upper surface of the insulating layer 51 in a set or predetermined pattern. A gate insulating layer 53 is formed to cover the semiconductor active layer 52. The semiconductor active layer 52 may include a p-type or n-type semiconductor material.

A gate electrode 54 of the TFT is formed in a region of the gate insulating layer 53 corresponding to the semiconductor active layer 52. An interlayer insulating layer 55 is formed to cover the gate electrode 54. The interlayer insulating layer 55 and the gate insulating layer 53 are etched by, for example, dry etching, to form a contact hole exposing parts of the semiconductor active layer 52.

Source/drain electrodes 56 and 57 are formed on the interlayer insulating layer 55 to contact the semiconductor active layer 52 through the contact hole. A protective layer 58 is formed to cover the source/drain electrodes 56 and 57, and is etched to expose a part of one of the drain electrode 57. An insulating layer 59 may be further formed on the protective layer 58 so as to planarize the protective layer 58.

In addition, the OLED displays set or predetermined image information by emitting red, green, or blue light according to current. The OLED includes a first electrode 61 disposed on the protective layer 58. The first electrode 61 is electrically connected to the exposed drain electrode 57 of the TFT.

A pixel-defining layer 60 is formed to cover the first electrode 61. An opening is formed in the pixel-defining layer 60, and an organic layer 62 including an emission layer (EML) is formed in a region defined by the opening. A second electrode 63 is formed on the organic layer 62.

The pixel-defining layer 60, which defines individual pixels, is formed of an organic material. The pixel-defining layer 60 also planarizes the surface of a region of a substrate in which the first electrode 61 is formed, and in particular, a surface of the insulating layer 59.

The first electrode 61 and the second electrode 63 are insulated from each other, and respectively apply voltages of opposite polarities to the organic layer 62 to induce light emission.

The organic layer 62 including an EML, may be formed of a low-molecular weight organic material or a high-molecular weight organic material. When a low-molecular weight organic material is used, the organic layer 62 may have a single or multi-layer structure including a hole injection layer (HIL), a hole transport layer (HTL), the EML, an electron transport layer (ETL), and/or an electron injection layer (EIL). Non-limiting examples of available organic materials may include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 62 including the EML may be formed using the organic layer deposition apparatus 1 illustrated in FIG. 1. That is, an organic layer deposition apparatus including a deposition source that discharges a deposition material, a deposition source nozzle unit that is disposed at a side of the deposition source and includes a plurality of deposition source nozzles formed therein, and a patterning slit sheet that faces the deposition source nozzle unit and includes a plurality of patterning slits formed therein is disposed spaced apart by a set or predetermined distance from a substrate on which the deposition material is to be deposited. In addition, the deposition material discharged from the organic layer deposition apparatus 1 (refer to FIG. 1) is deposited on the substrate 2 (refer to FIG. 1) while the organic layer deposition apparatus 1 and the substrate 2 are moved relative to each other.

After the organic layer 62 is formed, the second electrode 63 may be formed by the same deposition method as used to form the organic layer 62.

The first electrode 61 may function as an anode, and the second electrode 63 may function as a cathode. Alternatively, the first electrode 61 may function as a cathode, and the second electrode 63 may function as an anode. The first electrode 61 may be patterned to correspond to individual pixel regions, and the second electrode 63 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 63 may also be formed as a transparent electrode or a reflective electrode. When the second electrode 63 is formed as a transparent electrode, the second electrode 63 is used as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from ITO, IZO, ZnO, $In_2O_3$, or the like. When the second electrode 63 is formed as a reflective electrode, the reflective layer may be formed by depositing Li, Ca, LiF/Ca, LiF/Al, Al, Ag, Mg, or a compound thereof on the entire surface of the organic layer 63. The second electrode 63 may be formed using the same deposition method as used to form the organic layer 62 described above.

The organic layer deposition apparatuses according to the embodiments of the present invention described above may be applied to form an organic layer or an inorganic layer of an organic TFT, and to form layers from various materials.

According to the one or more embodiments of the present invention, it is possible to embody the organic light-emitting display apparatus that is manufactured by using the method of manufacturing the organic light-emitting display apparatus by using the organic layer deposition apparatus that is suitable for use in the mass production of a large substrate, that enables high-definition patterning, and that is capable of measuring and controlling a gap between a patterning slit sheet and a substrate that moves.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing an organic light-emitting display apparatus by using an organic layer deposition apparatus for forming an organic layer on a substrate, the method comprising:

fixing the substrate on a transfer unit in a loading unit;
conveying, into a chamber, the transfer unit on which the substrate is fixed, by using a first conveyer unit installed to pass through the chamber;
forming an organic layer by depositing a deposition material discharged from an organic layer deposition assembly on the substrate while the substrate is moved relative to the organic layer deposition assembly with the organic layer deposition assembly in the chamber being spaced apart from the substrate by a set distance;
separating the substrate on which the depositing of the deposition material has been completed from the transfer unit in an unloading unit; and
conveying the transfer unit from which the substrate is separated to the loading unit by using a second conveyer unit installed to pass through the chamber, and
wherein the forming of the organic layer comprises measuring a distance between the substrate and a patterning slit sheet while the substrate relatively moves with respect to the organic layer deposition assembly.

2. The method of claim 1, wherein the chamber comprises a plurality of the organic layer deposition assemblies, and wherein deposition is sequentially performed on the substrate by using each of the plurality of the organic layer deposition assemblies.

3. The method of claim 1, wherein the transfer unit is configured to cyclically move between the first conveyer unit and the second conveyer unit.

4. The method of claim 1, wherein the first conveyer unit and the second conveyer unit are respectively arranged above and below in parallel to each other.

5. The method of claim 1, wherein the patterning slit sheet of the organic layer deposition assembly is formed smaller than the substrate in a first direction in which the transfer unit is conveyed by the first conveyer unit.

6. The method of claim 1, wherein the organic layer deposition assembly comprises:
a deposition source for discharging the deposition material;
a deposition source nozzle unit at a side of the deposition source and comprising a plurality of deposition source nozzles;
the patterning slit sheet facing the deposition source nozzle unit and comprising a plurality of patterning slits arranged along a direction; and
a gap measuring unit for measuring a gap between the substrate and the patterning slit sheet, and
wherein the gap measuring unit comprises:
first gap measuring parts that are not disposed on the patterning slit sheet and are disposed on a virtual plane extending from the patterning slit sheet; and
second gap measuring parts that are disposed on the patterning slit sheet.

7. The method of claim 6, wherein the first gap measuring parts comprise at least two gap measuring units and the second gap measuring parts comprise at least four gap measuring units.

8. The method of claim 7, wherein the first gap measuring parts comprise a first gap measuring unit and a sixth gap measuring unit,
the second gap measuring parts comprise a second gap measuring unit, a third gap measuring unit, a fourth gap measuring unit, and a fifth gap measuring unit,
the first gap measuring unit, the second gap measuring unit, and the third gap measuring unit are configured whereby virtual lines that connect the first, second, and third gap measuring units form a triangle, and
the fourth gap measuring unit, the fifth gap measuring unit, and the sixth gap measuring unit are configured whereby virtual lines that connect the fourth, fifth, and sixth gap measuring units form a triangle.

9. The method of claim 8, wherein, when the substrate moves and thus is positioned below the first gap measuring unit, the second gap measuring unit, and the third gap measuring unit, the measuring of the distance comprises:
measuring, by the first gap measuring unit, a distance to the substrate, measuring, by each of the second gap measuring unit and the third gap measuring unit, a distance to the substrate and a distance to the patterning slit sheet, and thus measuring distances between the substrate and the patterning slit sheet at the first gap measuring unit, the second gap measuring unit, and the third gap measuring unit, respectively; and
when the distances between the substrate and the patterning slit sheet which are measured by the first gap measuring unit, the second gap measuring unit, and the third gap measuring unit are different from each other, moving the patterning slit sheet so as to synchronize the distances.

10. The method of claim 9, wherein the first gap measuring unit obtains the distance between the substrate and the patterning slit sheet by using a distance between the first gap measuring unit and a virtual patterning slit sheet as the distance to the patterning slit sheet, wherein the distance to the patterning slit sheet is measured by the second gap measuring unit or the third gap measuring unit.

11. The method of claim 9, wherein, when the substrate moves and thus is positioned below the second gap measuring unit, the third gap measuring unit, and the fifth gap measuring unit, the measuring of the distance comprises:
measuring, by each of the second gap measuring unit, the third gap measuring unit, and the fifth gap measuring unit, a distance to the substrate and a distance to the patterning slit sheet and obtaining a distance between the substrate and the patterning slit sheet at each of positions of the second gap measuring unit, the third gap measuring unit, and the fifth gap measuring unit; and
when the distances between the substrate and the patterning slit sheet which are measured by the second gap measuring unit, the third gap measuring unit, and the fifth gap measuring unit are different from each other, moving the patterning slit sheet so as to synchronize the distances.

12. The method of claim 11, wherein, when the substrate moves and thus is positioned below the fourth gap measuring unit, the fifth gap measuring unit, and the sixth gap measuring unit, the measuring of the distance comprises:
measuring, by the sixth gap measuring unit, a distance to the substrate, measuring, by each of the fourth gap measuring unit and the fifth gap measuring unit, a distance to the substrate and a distance to the patterning slit sheet, and thus measuring distances between the substrate and the patterning slit sheet at the fourth gap measuring unit, the fifth gap measuring unit, and the sixth gap measuring unit, respectively; and
when the distances between the substrate and the patterning slit sheet which are measured by the fourth gap measuring unit, the fifth gap measuring unit, and the sixth gap measuring unit are different from each other, moving the patterning slit sheet so as to synchronize the distances.

13. The method of claim 12, wherein the sixth gap measuring unit obtains the distance between the substrate and the patterning slit sheet by using a distance between the sixth gap measuring unit and a virtual patterning slit sheet as the distance to the patterning slit sheet, wherein the distance to the patterning slit sheet is measured by the fourth gap measuring unit or the fifth gap measuring unit.

* * * * *